(12) United States Patent
Koswatta et al.

(10) Patent No.: US 9,773,717 B1
(45) Date of Patent: Sep. 26, 2017

(54) INTEGRATED CIRCUITS WITH PELTIER COOLING PROVIDED BY BACK-END WIRING

(71) Applicant: GLOBALFOUNDRIES INC., Grand Cayman (KY)

(72) Inventors: Siyuranga O. Koswatta, Carmel, NY (US); Sungjae Lee, Schenectady, NY (US); Lan Luo, South Burlington, VT (US); Scott K. Springer, Burlington, VT (US); Richard A. Wachnik, Mount Kisco, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/242,643

(22) Filed: Aug. 22, 2016

(51) Int. Cl.

| H01L 23/38 | (2006.01) |
|---|---|
| H01L 35/20 | (2006.01) |
| H01L 35/22 | (2006.01) |
| H01L 35/04 | (2006.01) |
| H01L 35/28 | (2006.01) |
| H01L 35/34 | (2006.01) |
| H01L 35/16 | (2006.01) |
| H01L 35/18 | (2006.01) |
| H01L 27/12 | (2006.01) |
| H01L 27/16 | (2006.01) |

(52) U.S. Cl.
CPC .......... *H01L 23/38* (2013.01); *H01L 27/1203* (2013.01); *H01L 27/16* (2013.01); *H01L 35/04* (2013.01); *H01L 35/16* (2013.01); *H01L 35/18* (2013.01); *H01L 35/20* (2013.01); *H01L 35/22* (2013.01); *H01L 35/28* (2013.01); *H01L 35/34* (2013.01)

(58) Field of Classification Search
CPC .............................. H01L 23/38; H01L 27/16
See application file for complete search history.

(56) References Cited

U.S. PATENT DOCUMENTS

| 5,079,618 A | 1/1992 | Farnworth |
|---|---|---|
| 6,080,608 A | 6/2000 | Nowak |
| 6,121,661 A | 9/2000 | Assaderaghi et al. |

(Continued)

OTHER PUBLICATIONS

"Bismuth telluride", https://en.wikipedia.org/wiki/Bismuth_telluride, Jul. 10, 2015, 4 pgs.

(Continued)

*Primary Examiner* — Benjamin Sandvik
(74) *Attorney, Agent, or Firm* — Gibb & Riley, LLC; Anthony J. Canale

(57) ABSTRACT

A semiconductor structure comprises one or more semiconductor devices, each of the semiconductor devices having two or more electrical connections; one or more first conductors connected to a first electrical connection on the semiconductor device, the first conductor comprising a first material having a positive Seebeck coefficient; and one or more second conductors connected to a second electrical connection on the semiconductor device, the second conductor comprising a second material having a negative Seebeck coefficient. The first conductor and the second conductor conduct electrical current through the semiconductor device and conduct heat away from the semiconductor device.

18 Claims, 28 Drawing Sheets

(56) References Cited

U.S. PATENT DOCUMENTS

| | | | |
|---|---|---|---|
| 6,333,557 B1 | 12/2001 | Sullivan | |
| 6,476,483 B1 | 11/2002 | Adler et al. | |
| 6,588,217 B2* | 7/2003 | Ghoshal | H01L 23/38 |
| | | | 257/E23.082 |
| 6,674,128 B1 | 1/2004 | Fisher | |
| 6,774,450 B2* | 8/2004 | Inbe | H01L 23/38 |
| | | | 136/201 |
| 6,800,933 B1 | 10/2004 | Mathews et al. | |
| 6,818,817 B2 | 11/2004 | Macris | |
| 8,129,609 B2 | 3/2012 | Chen et al. | |
| 8,319,331 B2 | 11/2012 | Ibaraki | |
| 8,344,359 B2 | 1/2013 | Bettencourt et al. | |
| 8,426,720 B2 | 4/2013 | Liu et al. | |
| 8,598,636 B2 | 12/2013 | Huang et al. | |
| 8,598,700 B2 | 12/2013 | Gu et al. | |
| 8,766,083 B2 | 7/2014 | Span | |
| 8,912,032 B2 | 12/2014 | Assefa et al. | |
| 8,987,062 B2 | 3/2015 | Gu et al. | |
| 9,437,652 B2* | 9/2016 | Debord | H01L 27/16 |
| 2003/0129783 A1 | 7/2003 | Pomerene et al. | |
| 2004/0155251 A1 | 8/2004 | Abramov et al. | |
| 2006/0237730 A1* | 10/2006 | Abramov | H01L 23/38 |
| | | | 257/81 |
| 2007/0095382 A1* | 5/2007 | Snyder | H01L 35/16 |
| | | | 136/236.1 |
| 2007/0240751 A1* | 10/2007 | Takahashi | H01L 35/20 |
| | | | 136/205 |
| 2008/0190115 A1* | 8/2008 | Yu | H01L 35/32 |
| | | | 62/3.2 |
| 2009/0056345 A1* | 3/2009 | Edwards | H01L 23/38 |
| | | | 62/3.7 |
| 2013/0330853 A1* | 12/2013 | Tischler | H01L 21/78 |
| | | | 438/27 |
| 2014/0305484 A1* | 10/2014 | Jung | H01L 35/16 |
| | | | 136/238 |

OTHER PUBLICATIONS

"Chromel", https://en.wikipedia.org/wiki/Chromel, Jul. 10, 2015, 2 pgs.

"Constantan", https://en.wikipedia.org/wiki/Constantan, Jul. 10, 2015, 3 pgs.

"Fabrication and characterization of electrodeposited antimony telluride crystalline nanowires and nanotubes", D. Pinisetty et al., Journal of Materials Chemistry, Issue 12,2011, Jul. 10, 2015, 1 pgs, Abstract only.

"Seebeck coefficient", https://en.wikipedia.org/wiki/Seebeck_coefficient, Jul. 10, 2015, 10 pgs.

"Thermoelectric materials", https://en.wikipedia.org/wiki/Thermoelectric_materials, Jul. 10, 2015, 15 pgs.

* cited by examiner

INTEGRATED CIRCUITS WITH PELTIER COOLING PROVIDED BY BACK-END WIRING

CROSS REFERENCE TO RELATED APPLICATIONS

This application is related to U.S. patent application Ser. No. 14/927,799, which was filed on Oct. 30, 2015 naming all of the same inventors and no others and which was, pursuant to a petition granted on Apr. 6, 2016 by the U.S. Patent and Trademark Office, expressly abandoned to avoid publication.

BACKGROUND

The exemplary embodiments of this invention relate generally to semiconductor devices and techniques for the fabrication thereof and, more specifically, to structures and methods for the efficient flow of heat through semiconductor devices.

A complementary metal oxide semiconductor device (CMOS) uses pairs of p-type and n-type metal oxide semiconductor field effect transistors (MOSFETs) arranged on silicon or silicon-on-insulator (SOI) substrates. A MOSFET, which is used for amplifying or switching electronic signals for logic functions, has source and drain regions connected by a channel. The source region is a terminal through which current enters the channel, and the drain region is a terminal through which current leaves the channel. A gate overlies the channel and controls the flow of current between the source and drain regions. In some devices, the channel may be a thin "fin" through which the gate controls the flow of current, thereby making the PFETs and NFETs "finFET" devices. In other devices, the channel may be a nanowire, thereby defining the devices as nanowire-FET devices.

There is a continued desire to reduce the size of structural features of such devices in order to provide a greater amount of circuitry on a given integrated circuit (IC) chip. Doing so generally allows for increased performance (more processing per clock cycle and less heat generated) at lower power levels and lower cost. However, the present technology is at or approaching atomic level scaling of certain micro-devices.

With continued device scaling (higher power densities, etc.), local heating in IC chips is reaching levels that could impact system reliability. Particularly with regard to finFETs and nanowire-FET geometries, the effects of device heating have become worse as compared to planar technologies. In addition to heating problems at the circuit scale (about 100-1000 micrometers), individual devices themselves may heat up and create micro-hot-spots on an IC chip. Excess heating of devices or excess heat on an IC chip may cause an unnecessary dissipation of power, thereby compromising device or circuit efficiency and reliability. For example, heat may cause power to be dissipated in an SOI layer located between a buried oxide (BOX) layer and a dielectric layer.

Presently, heat sinking is often carried out at a package level. In other words, heat is removed from circuits and devices in bulk via thermal transport from a device region to a heat sink through passive transport mechanisms such as thermal conduction.

Heat may also be removed from some circuits using Peltier cooling. Peltier cooling may be achieved through the use of additional structures by incorporating Peltier junctions that are separate from the actual device from which heat is desired to be removed. This type of cooling, however, suffers from a few main drawbacks, namely, (1) Peltier junctions are not intrinsically integrated into the devices themselves, which reduces cooling efficiency; (2) Peltier cooling requires additional power supply into the system; and (3) in addition to fabrication of the actual semiconductor device, Peltier cooling structures need also to be fabricated, thus increasing process/integration complexity.

BRIEF SUMMARY

In one exemplary aspect, a semiconductor structure comprises one or more semiconductor devices, each of the semiconductor devices having two or more electrical connections; one or more first conductors connected to a first electrical connection on the semiconductor device, the first conductor comprising a first material having a positive Seebeck coefficient; and one or more second conductors connected to a second electrical connection on the semiconductor device, the second conductor comprising a second material having a negative Seebeck coefficient. The first conductor and the second conductor conduct electrical current through the semiconductor device and conduct heat away from the semiconductor device.

In another exemplary aspect, a semiconductor structure comprises a P substrate; an N band disposed on the P substrate; an oxide layer on the N band; a first material having a positive Seebeck coefficient disposed in a first trench extending into the oxide layer, the N band and the P substrate; a second material having a negative Seebeck coefficient disposed in a second trench extending into the oxide layer and the N band; a first contact on the first material and providing contact with a metal layer and, particularly, a first metal level metal layer (referred to as the M1 layer); and a second contact on the second material and providing contact with metal layer. The first material is configured to provide a first heat flow from the metal layer into the P substrate. The second material is configured to provide a second heat flow from the metal layer into the N band. A first current flow is from the first contact, into the first material, and to the P substrate. A second current flow is from the N band, into the second material, and to the second contact.

In another exemplary aspect, a method comprises patterning a first layer disposed over a semiconductor device; etching first openings through the first layer to the semiconductor device; depositing a first material having a first Seebeck coefficient in the first openings; patterning a second layer over the semiconductor device and the n-type material; etching second openings through the second layer to the semiconductor device; and depositing a second material having a second Seebeck coefficient in the second openings. One of the first material and the second material may have a positive Seebeck coefficient and the other of the second material and the first material may have a negative Seebeck coefficient. The deposited first material and the deposited second material may form portions of a contact.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

Figure 1A:
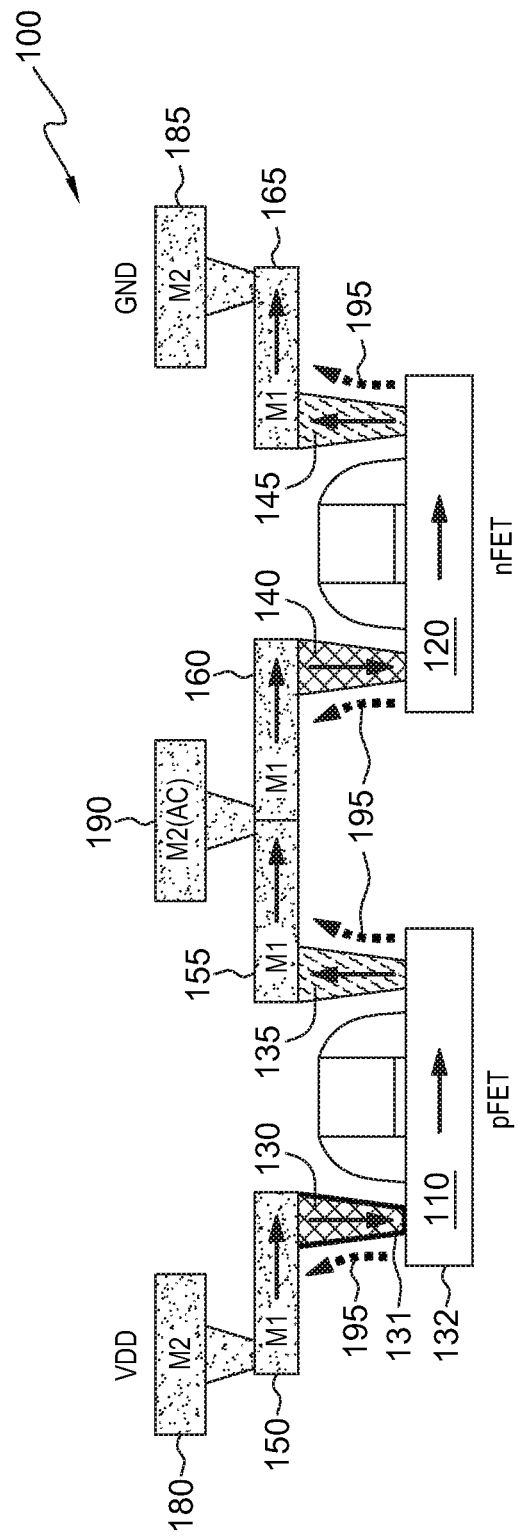
FIGS. 1A-1C are schematic representations of one exemplary embodiment of a semiconductor device structure that utilizes a Peltier cooling effect.

Based on the drawbacks associated with heat sinking at the package level and with the use of cooling structures having junctions that are separate from the actual devices from which heat is to be removed, it is desirable to actively remove heat from device regions via Peltier cooling with minimal impact on process complexity. Exemplary mechanisms for doing so may be realized at the individual device level. Furthermore, Peltier cooling could be intrinsically integrated into a device, thus maximizing active heat removal efficiency, without the incorporation of separated Peltier junctions.

Referring to the Figures herein, device structures for use in semiconductors and methods for the manufacture thereof are described. The device structures utilize two different materials for the contact (CA) formation, via formation, and/or back-end-of-line (BEOL) metal levels such that efficient heat removal from regions of the device can be obtained. The configuration of the two different materials provides the Peltier effect, in which a heat flux is created between the two different materials to determine the active heat removal rate. The combination of materials may be used with double patterning techniques of CA, vias, and/or metal layers (Mx) into processes for the manufacture of the device structures. Furthermore, these materials may be incorporated into the device structure itself (for example, into CAs, power rails, and the like) in order to allow Peltier cooling junctions to be intrinsically integrated into individual devices or into the circuit itself. For example, a Peltier-cooled device could be a transistor, a FET, a diode, a resistor, a chip-embedded device or any other device on a chip. The Peltier-cooled device could also be an entire circuit block, such as an inverter or a combination of logic gates, or a power rail. Moreover, the device structures and methods disclosed herein are not limited to logic IC design, but can be utilized in other electronic devices including, but not limited to, power transistors, RF transistors, monolithic microwave integrated circuits (MMICs), and the like.

As used herein, material combinations for use in the device structures and methods disclosed herein are paired thermocouple materials. Such thermocouple materials include, but are not limited to, Cu-Constantan, Nichrome-Constantan, Tungsten-Rhenium, Tungsten-Constantan, Tungsten-Doped $Bi_2Te_3$ (or other bismuth chalcogenides), or any other thermocouple material. Constantan may be about 55% copper and about 45% nickel. Nichrome may be about 90% nickel and about 10% chromium. The material combinations are not limited to metals, however, as polysilicon materials may be used, as described herein.

Each portion of a paired thermocouple material has an associated Seebeck coefficient (S), which is a measure of the magnitude of an induced thermoelectric voltage in response to a temperature difference across that material, as induced by the conversion of temperature differences directly into electricity and which is measured in volts per absolute temperature in Kelvin. Seebeck coefficients are generally measured relative to platinum (S=1), the actual Seebeck coefficient of platinum being about −5 μV/K (microvolts per Kelvin degree) at room temperature. The difference between the coefficients of the material having the positive Seebeck coefficient and the material having the negative Seebeck coefficient is about 40 μV/K or greater.

The Seebeck coefficient for a p-type material and the Seebeck coefficient for an n-type material can be used to determine the active heat removal rate in a FET by the Peltier effect using the equation:

$$P_{Peltier} = (P_P - P_N) * I_{DS} \quad \text{(eq. 1)}$$

Where $P_{P/N}=(S_{P/N}*T)$ with $P_{P/N}$=Peltier coefficients of the materials (in Volts), $S_{P/N}$=Seebeck coefficients of the materials (in Volts per Kelvin), and T=absolute temperature (in Kelvins).

Power dissipation under normal operating conditions in a FET (e.g., in a CMOS under switching operations) can be determined using the equation:

$$P_{DC}=I_{DC}*(V_{DD}/2) \qquad \text{(eq. 2)}$$

Accordingly, the efficiency of active heat removal under the Peltier effect can be determined using the equation:

$$\text{Efficiency}=P-P_{Peltier}/P_{DC}=[(S_P-S_N)*T]/(V_{DD}/2) \qquad \text{(eq. 3)}$$

Figure 1B:
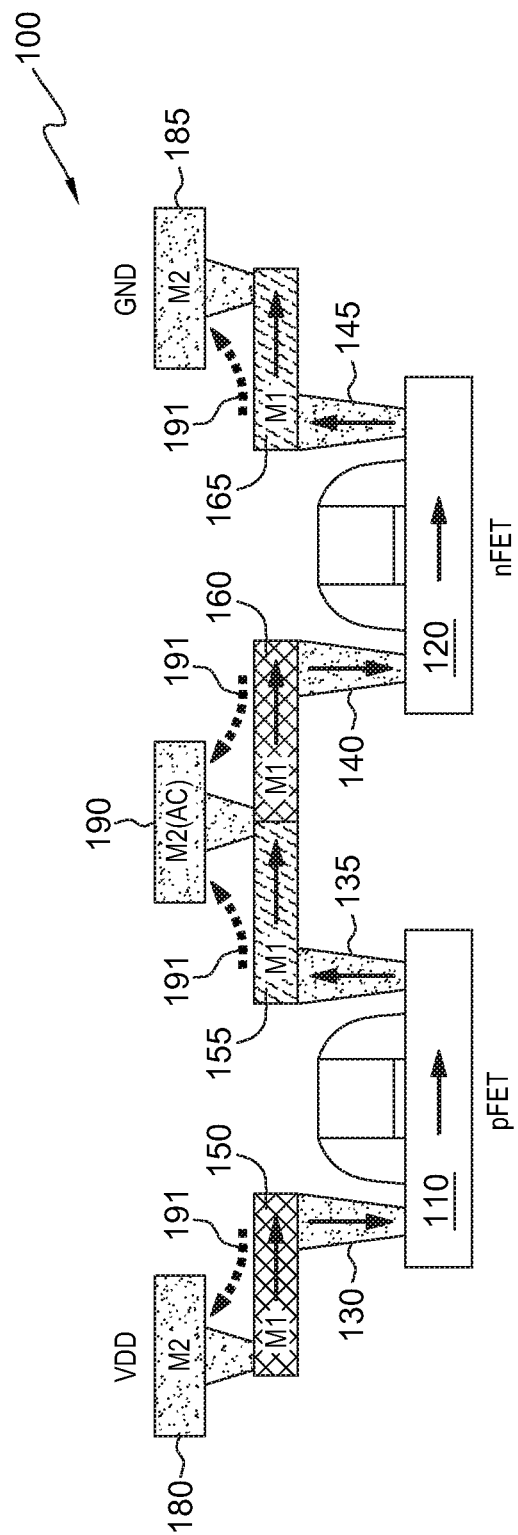
Figure 1C:
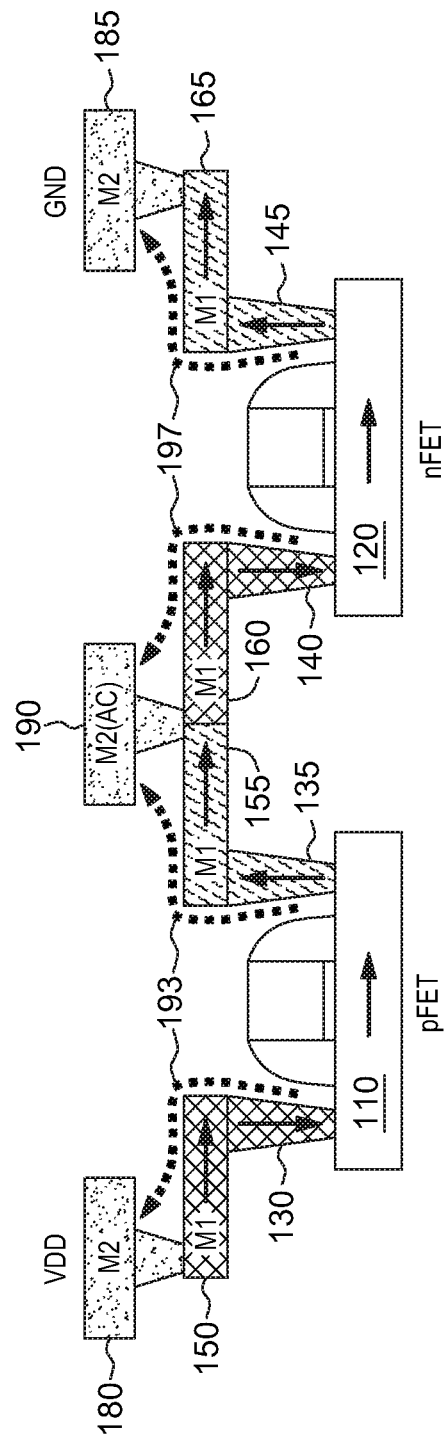

Referring to FIGS. 1A-1C, one exemplary embodiment of a device structure using the Peltier effect to cool portions of a device structure is shown generally at 100 and is hereinafter referred to as "device 100." As shown, the device 100 comprises a PFET 110 and an NFET 120, the PFET 110 having a first metal contact 130 and a second metal contact 135 (for example, formed as vias), and the NFET 120 having a first metal contact 140 and a second metal contact 145 (for example, formed as vias), together which form the contact (CA).

The first metal contact 130 on the PFET 110 is in communication with a first metal conductor 150, and the second metal contact 135 on the PFET 110 is in communication with a second metal conductor 155. The first metal contact 140 on the NFET 120 is in communication with a first metal conductor 160, and the second metal contact 145 on the NFET 120 is in communication with a second metal conductor 165. The first metal conductor 150, the second metal conductor 155, the first metal conductor 160, and the second metal conductor 165 may define portions of an M1 layer. The metal contacts 130, 135, 140, and 145 (or the metal conductors) may comprise 0.5% manganese alloyed copper, and the metal conductors 150, 155, 160, and 165 (or the metal contacts) may comprise 30% (or more) nickel alloyed copper.

The first metal contact 130 may be encapsulated within a liner material 131 that is in direct contact with an underlying silicide 132 of the PFET 110 or NFET 120. Although the liner material 131 is only shown on the first metal contact 130, it should be understood that the liner material 131 may be deposited on any or all of the metal contacts 130, 135, 140, and 145. The liner material may comprise Ti—TiN or the like. The silicide of the PFET 110 or NFET 120 may comprise TiSi or TiNbSi, or III-V material or carbon, or combinations of the foregoing or the like.

The first metal conductor 150 receives power supply voltage $V_{DD}$ through an input terminal 180 in an M2 layer (and possibly through a via), and the second metal conductor 165 is connected to a ground terminal 185 (possibly through a via) in the M2 layer such that direct current (DC) flows from the input terminal 180 to the ground terminal 185. The second metal conductor 155 on the PFET 110 and the first metal conductor 160 on the NFET 120 are in contact with each other, and a junction of the second metal conductor 155 and the first metal conductor 160 is in contact with an output terminal 190 (possibly through a via) also in the M2 layer.

In FIG. 1A, heat flow in the device 100 is shown only with regard to the CA. Heat is taken from the PFET 110 through the first metal contact 130 and the second metal contact 135. The first metal contact 130 and the second metal contact 135 may comprise a thermocouple material as described herein (e.g., Cu-Constantan, Nichrome-Constantan, Tungsten-Rhenium, Tungsten-Constantan, Tungsten-Doped $Bi_2Te_3$ (or other bismuth chalcogenides) or the like). As shown, the first metal contact 130 on the PFET 110 comprises an n-type of material having a Seebeck coefficient of less than zero (S<0), and the second metal contact 135 comprises a p-type of material having a Seebeck coefficient of greater than zero (S>0). Similarly, heat is also taken from the NFET 120 through the first metal contact 140 and the second metal contact 145, with the first metal contact 140 and the second metal contact 145 comprising a thermocouple material as described herein. As with the PFET 110, the first metal contact 140 on the NFET 120 comprises an n-type of material having a Seebeck coefficient of less than zero (S<0), and the second metal contact 145 comprises a p-type of material having a Seebeck coefficient of greater than zero (S>0). The first metal contact and the second metal contact on each of the PFET 110 and the NFET 120 are of different materials. Thus, using the Peltier effect, heat is drawn from the PFET 110 and the NFET 120, as shown by arrows 195, into the M1 layer.

In FIG. 1B, heat flow in the device 100 is shown only with regard to the M1 layer. In the M1 layer, the first metal conductor 150 receives heat from the first metal contact 130, and the second metal conductor 155 receives heat from the second metal contact 135. The first metal conductor 150 comprises the same thermocouple material as the first metal contact 130, and the second metal conductor 155 comprises the same thermocouple material as the second metal contact 135. Additionally, the first metal conductor 160 receives heat from the first metal contact 140, and the second metal conductor 165 receives heat from the second metal contact 145. The first metal conductor 160 comprises the same thermocouple material as the first metal contact 140, and the second metal conductor 165 comprises the same thermocouple material as the second metal contact 145. Heat is drawn through the M1 layer to the M2 layer as shown by arrows 191.

In FIG. 1C, heat flow in the device 100 is shown with regard to both the CA and the M1 layer. In particular, heat flow from the PFET 110 is shown through the first metal contact 130 and the first metal conductor 150 to the input terminal 180 and through the second metal contact 135 and the second metal conductor to the output terminal 190 (arrows 193). Also, heat flow from the NFET 120 is shown through the first metal contact 140 and the first metal conductor 160 to the output terminal 190 and through the second metal contact 145 and the second metal conductor 165 to the ground terminal 185 (arrows 197).

Figure 2A:
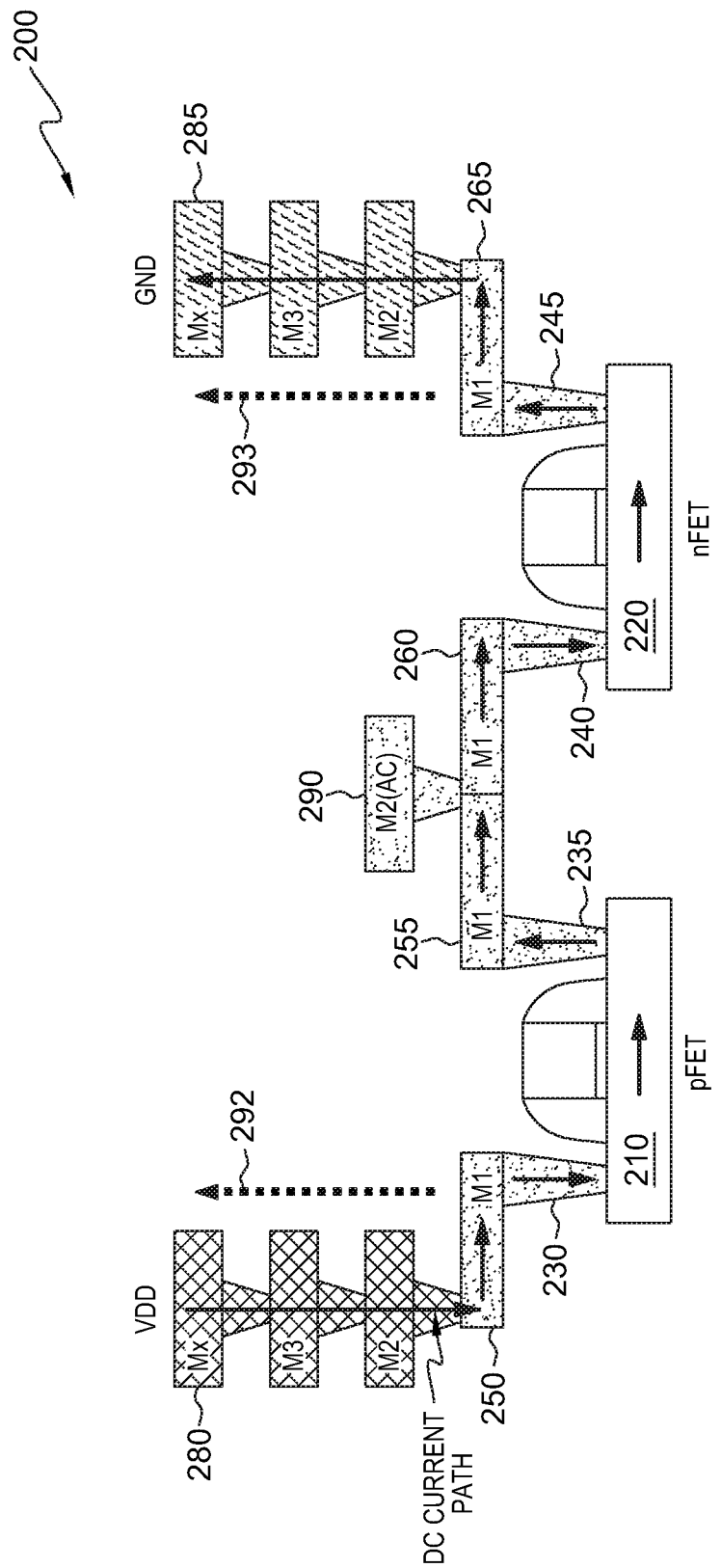
FIGS. 2A and 2B are schematic representations of another exemplary embodiment of a semiconductor device structure that utilizes a Peltier cooling effect.
Figure 2B:
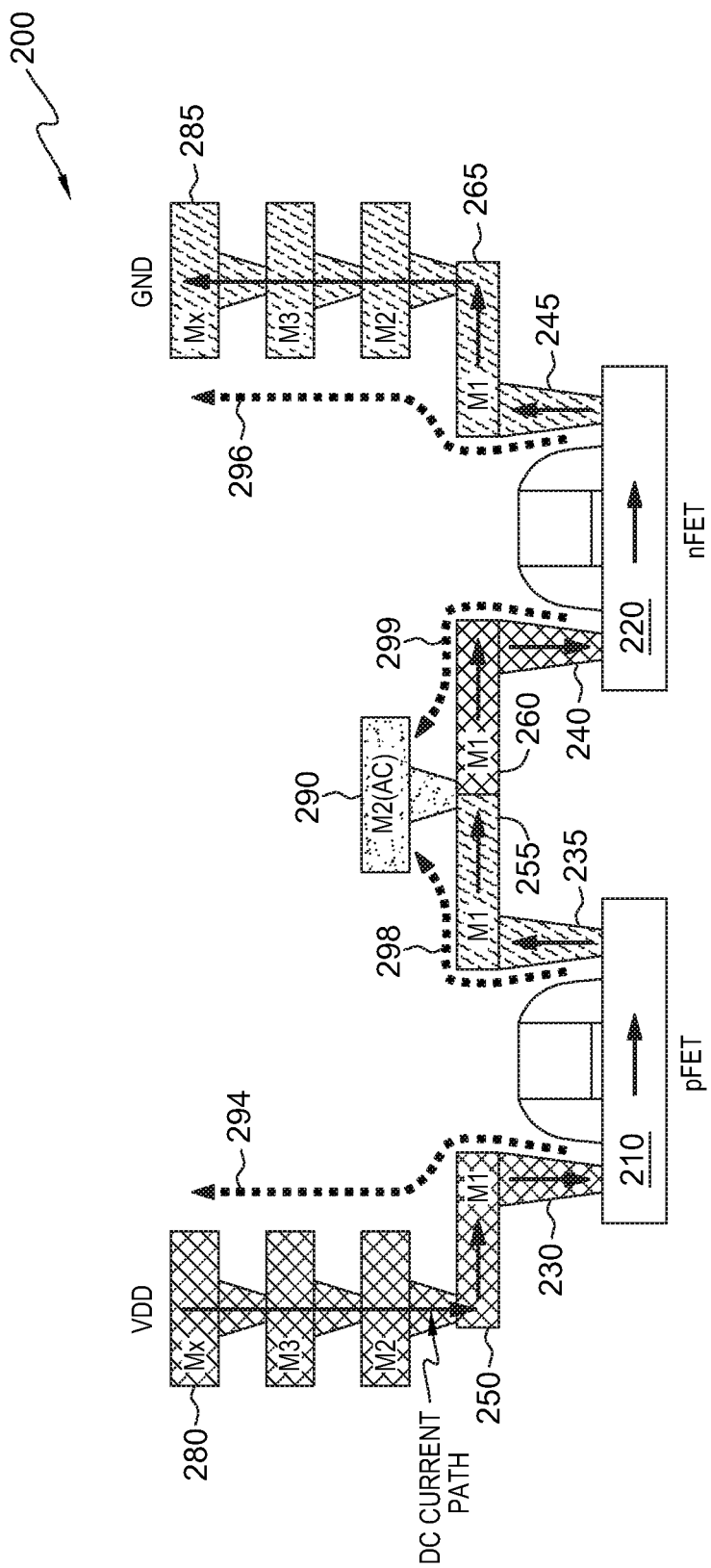

Referring now to FIGS. 2A and 2B, another exemplary embodiment of a device structure using the Peltier effect to cool portions of the device structure is shown generally at 200 and is hereinafter referred to as "device 200." As shown, the device 200 comprises a PFET 210 and an NFET 220, the PFET 210 having a first metal contact 230 and a second metal contact 235 (for example, formed as vias), and the NFET 220 having a first metal contact 240 and a second metal contact 245 (for example, formed as vias), together which form the contact (CA). As with the previous exemplary embodiment, the first metal contact 230 on the PFET 210 is in communication with a first metal conductor 250, and the second metal contact 235 on the PFET 210 is in communication with a second metal conductor 255. The first metal contact 240 on the NFET 220 is in communication with a first metal conductor 260, and the second metal contact 245 on the NFET 220 is in communication with a second metal conductor 265. The first metal conductor 250, the second metal conductor 255, the first metal conductor 260, and the second metal conductor 265 may define portions of a metal layer and, particularly, the first metal level metal layer (referred to as the M1 layer).

However, the M1 layer may be in contact with a second metal layer (e.g., a second metal level metal layer (referred to as an M2 layer)), possibly through vias. The M2 layer may be in contact with a third metal layer (e.g., a third metal level metal layer (referred to as an M3 layer)), possibly through vias. Any number of metal layers through a last metal level metal layer (referred to as an Mx layer) may be arranged on the device 200.

The first metal conductor 250 receives power supply voltage $V_{DD}$ through an input terminal 280 in the Mx layer, and the second metal conductor 265 is connected to a ground terminal 285 (possibly through a via) in the Mx layer such that DC flows from the input terminal 280 to the ground terminal 285. The second metal conductor 255 on the PFET 210 and the first metal conductor 260 on the NFET 220 are in contact with each other, and a junction of the second metal conductor 255 and the first metal conductor 260 is in contact with an output terminal 290 (possibly through a via) also in the M2 layer.

As shown in FIG. 2A, heat flow from the M1 layer is shown. In particular, heat is carried away (shown by arrow 292) from portions of the M1 layer comprising the first metal conductor 250 through the M2, M3, and subsequent layers to the input terminal 280. Heat is also carried away (shown by arrow 293) from portions of the M1 layer comprising the second metal conductor 265 through the M2, M3, and subsequent layers to the ground terminal 285.

As shown in FIG. 2B, heat flow from the BEOL/M1/CA is shown. In particular, heat is carried away (shown by arrow 294) from the PFET 210 through the first metal contact 230 to the first metal conductor 250 and subsequently through the M2, M3, and subsequent layers to the input terminal 280. Heat is also carried away (shown by arrow 296) from the NFET through the second metal contact 245 to the second metal conductor 265 and subsequently through the M2, M3, and subsequent layers to the ground terminal 285. Furthermore, heat is carried away (shown by arrow 298) from the PFET 210 through the second metal contact 235 and the second metal conductor 255 to the output terminal 290, while heat is further carried away (shown by arrow 299) from the NFET 220 through the first metal contact 240 and the first metal conductor 260 to the output terminal 290.

As with the previous exemplary embodiment, the first and second contacts to each of the PFET 210 and the NFET 220 are of different materials. The structure from the input terminal 280 through the Mx, M3, and M2 layers and further through the first metal conductor 250 of the M1 layer and still further through the first metal contact 230 comprises an n-type of material having a Seebeck coefficient of less than zero (S<0). Also, the structure from the second metal contact 245, through the second metal conductor 265 of the M1 layer, and through the M2, M3, and Mx layers to the ground terminal 285 comprises a p-type of material having a Seebeck coefficient of greater than zero (S>0). Additionally, the second metal contact 235 on the PFET 210 and the second metal conductor 255 are of the same p-type of material (S>0), and the first metal contact 240 on the NFET 220 and the first metal conductor 260 are of the same n-type of material (S<0).

Referring to FIGS. 3A-3J, one exemplary method of forming the CA or vias of the device 100 using double patterning is shown and is hereinafter referred to as "method 300."

Figure 3A:
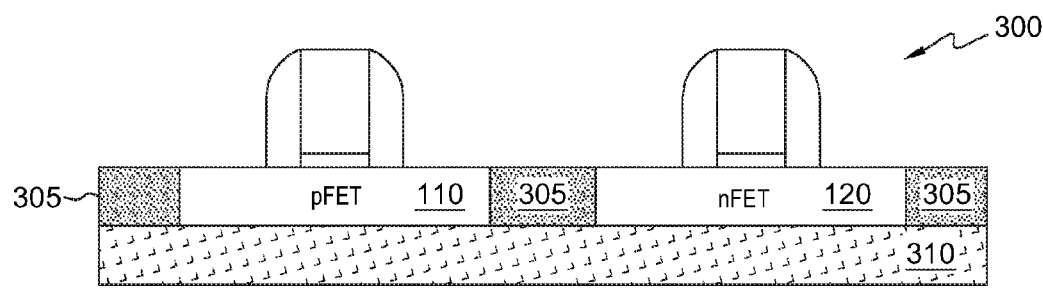
FIGS. 3A-3J are schematic representations of one exemplary embodiment of a method of forming a CA or vias of the semiconductor device structure of FIGS. 1A-1C.

As shown in FIG. 3A, shallow trench isolation (STI) techniques may be used to etch patterns into a layer of oxide material on a substrate (e.g., silicon). Dielectric material 305 (e.g., $SiO_2$) may then be deposited into the trenches. The PFET 110 and the NFET 120 are then formed around the deposited dielectric material such that the layer of oxide material on the substrate becomes a buried oxide (BOX) layer 310.

Figure 3B:
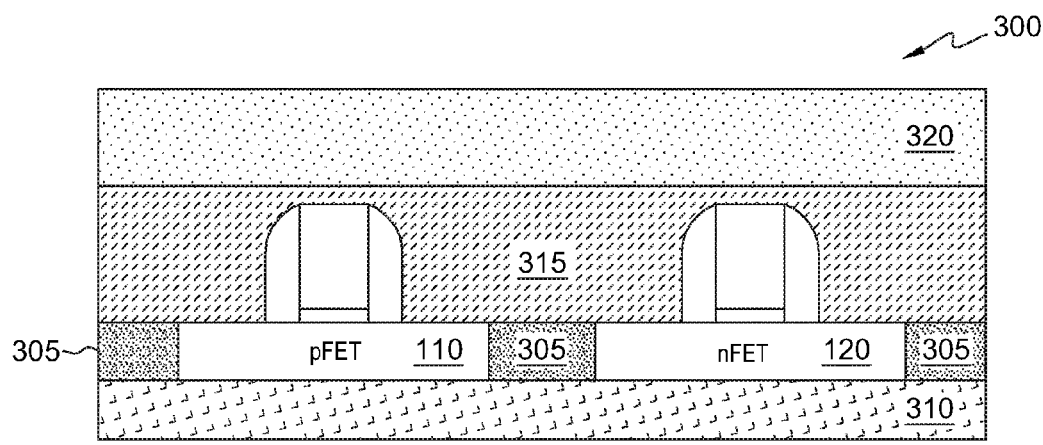

As shown in FIG. 3B, a first inter-layer dielectric (ILD) 315 (first ILD 315) may be deposited over the PFET 110 and the NFET 120 as well as over exposed dielectric material 305. The first ILD 315 may comprise $SiO_2$. A first photoresist/pattern transfer layer 320 may be deposited on the first ILD 315 and patterned.

Figure 3C:
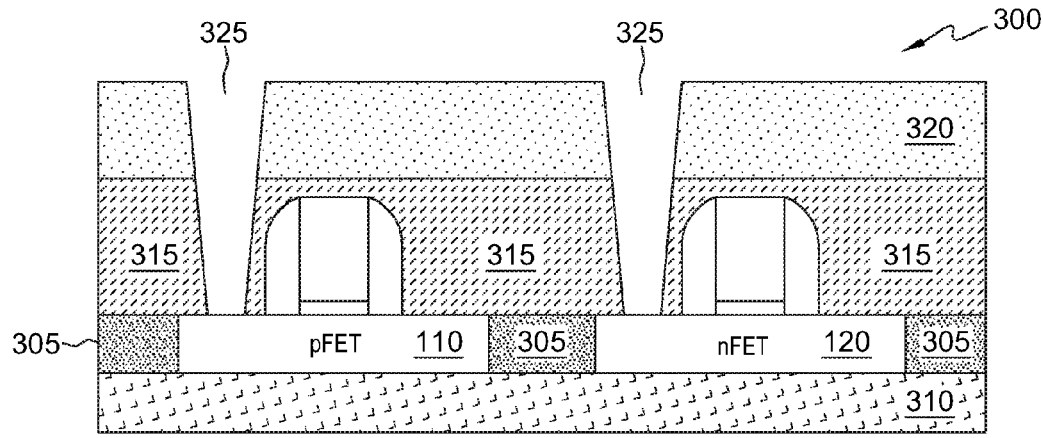

As shown in FIG. 3C, first openings 325 are etched through the first photoresist/pattern transfer layer 320 and the first ILD 315 to the PFET 110 and the NFET 120.

Figure 3D:
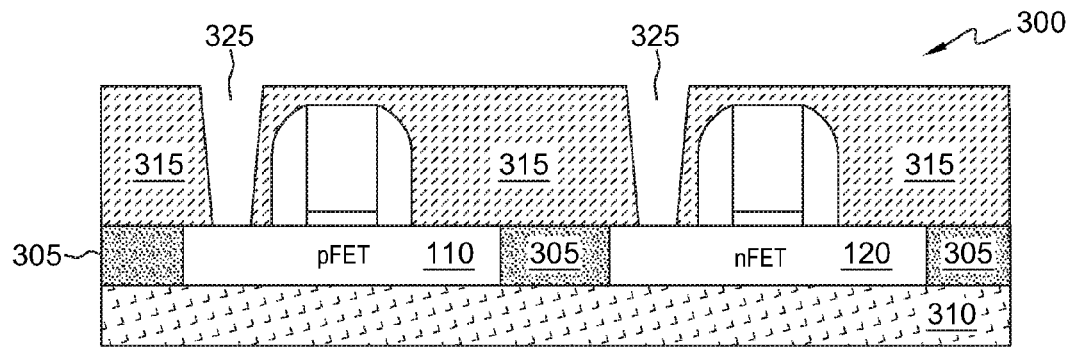

As shown in FIG. 3D, the first photoresist/pattern transfer layer 320 is removed (e.g., using a planarization technique).

Figure 3E:
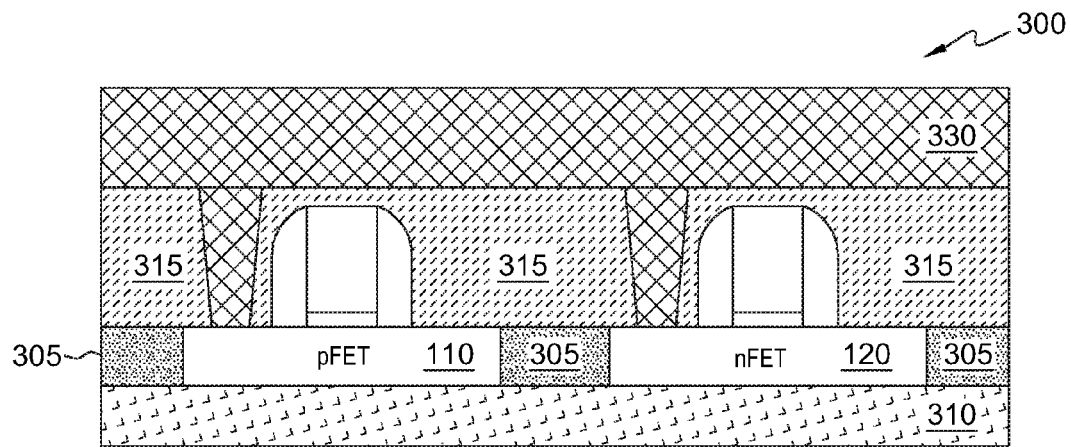

As shown in FIG. 3E, the n-type material (S<0) is deposited as a layer 330 on the first ILD 315 and in the first openings 325.

Figure 3F:
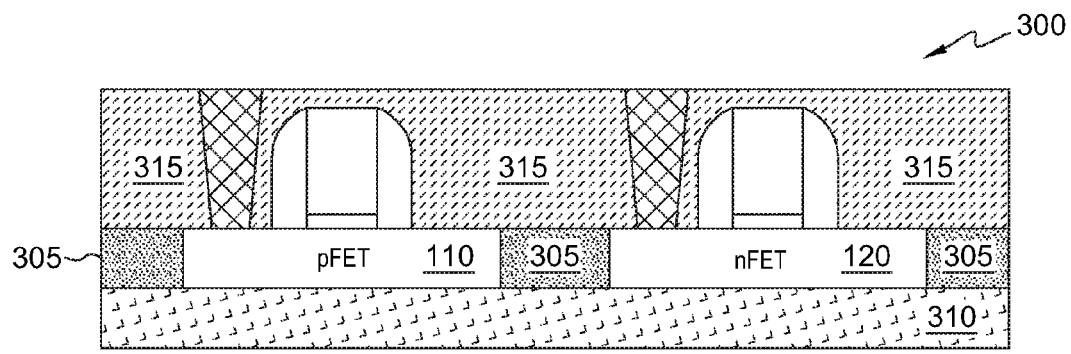

As shown in FIG. 3F, the n-type material layer 330 is removed from the first ILD 315 (e.g., using a planarization technique). N-type material, however, remains in the first openings 325 to form the first metal contact 130 on the PFET 110 and the first metal contact 140 on the NFET 120.

Figure 3G:
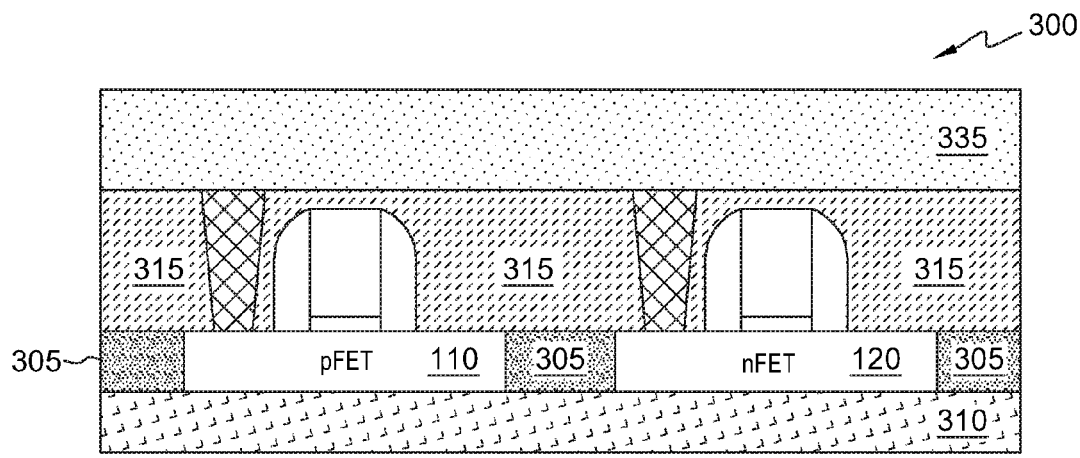

As shown in FIG. 3G, a second photoresist/pattern transfer layer 335 is deposited on the first ILD 315 and over the first metal contact 130 on the PFET 110 and the first metal contact 140 on the NFET 120 and patterned.

Figure 3H:
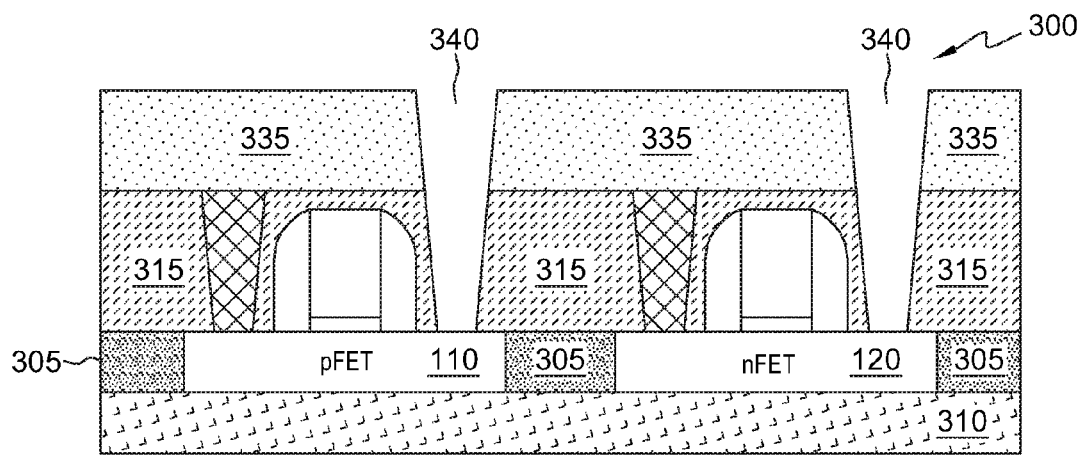

As shown in FIG. 3H, second openings 340 are etched through the second photoresist/pattern transfer layer 335 and the first ILD 315 to the PFET 110 and the NFET 120.

Figure 3I:
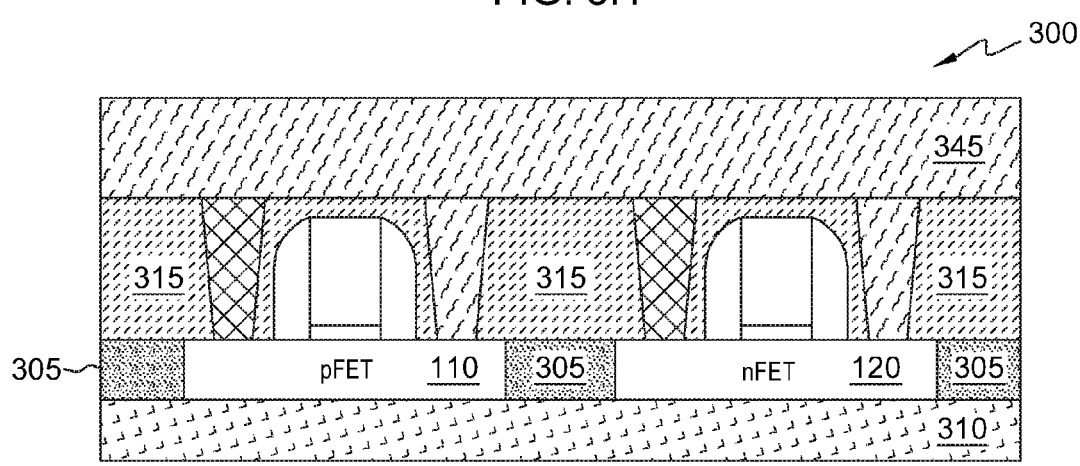

As shown in FIG. 3I, the second photoresist/pattern transfer layer 335 is removed, and the p-type material (S>0) is deposited as a layer 345 on the first ILD 315, on the n-type material in the first openings 325 forming the first metal contact 130 on the PFET 110 and the first metal contact 140 on the NFET 120, and in the second openings 340.

Figure 3J:
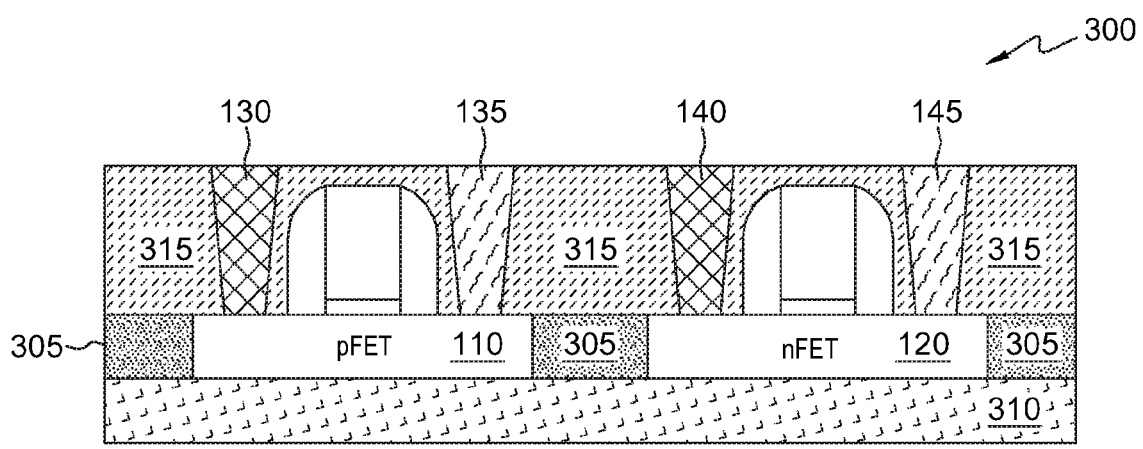

As shown in FIG. 3J, the p-type material layer 345 is removed (e.g., using a planarization technique). P-type material, however, remains in the second openings 340 to form the second metal contact 135 on the PFET 110 and the second metal contact 145 on the NFET 120.

Referring now to FIGS. 4A-4K, one exemplary method of forming a metal layer of the device 100 using double patterning is shown and is hereinafter referred to as "method 400." The forming of the metal layer is further to the formed CA or vias from above. Any number of metal layers (through Mx) can be formed.

Figure 4A:
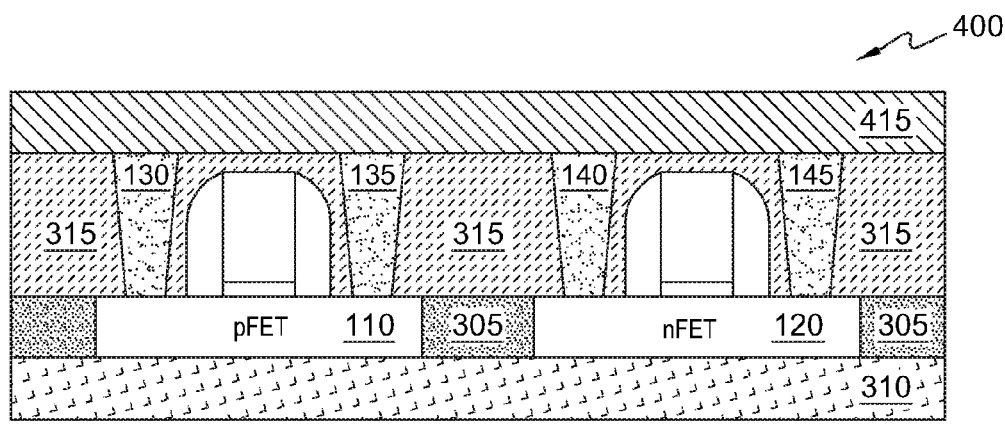
FIGS. 4A-4K are schematic representations of one exemplary embodiment of a method of forming a metal layer of the semiconductor device structure of FIGS. 1A-1C.

As shown in FIG. 4A, from the device 100 having the formed CA, a second ILD 415 may be deposited over the first ILD 315 and the first metal contact 130, the second metal contact 135, the first metal contact 140, and the second metal contact 145. The second ILD 415 may comprise a silicon nitride (e.g., SiN).

Figure 4B:
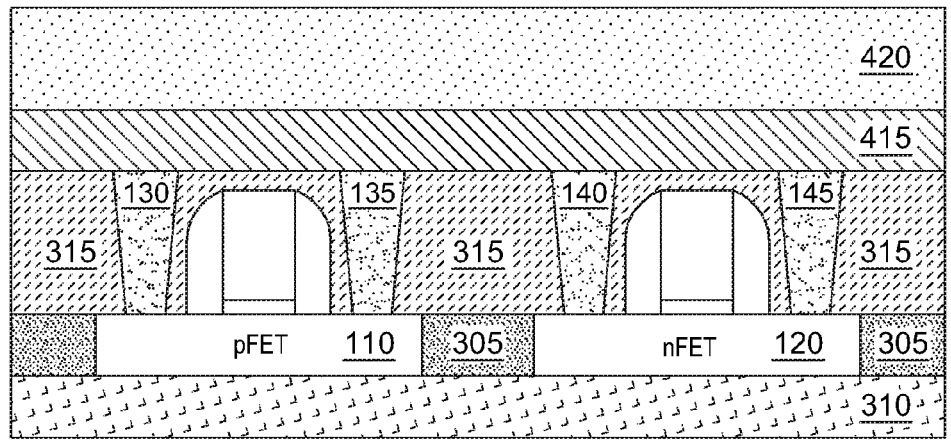

As shown in FIG. 4B, a third photoresist/pattern transfer layer 420 is deposited on the second ILD 415 and patterned.

Figure 4C:
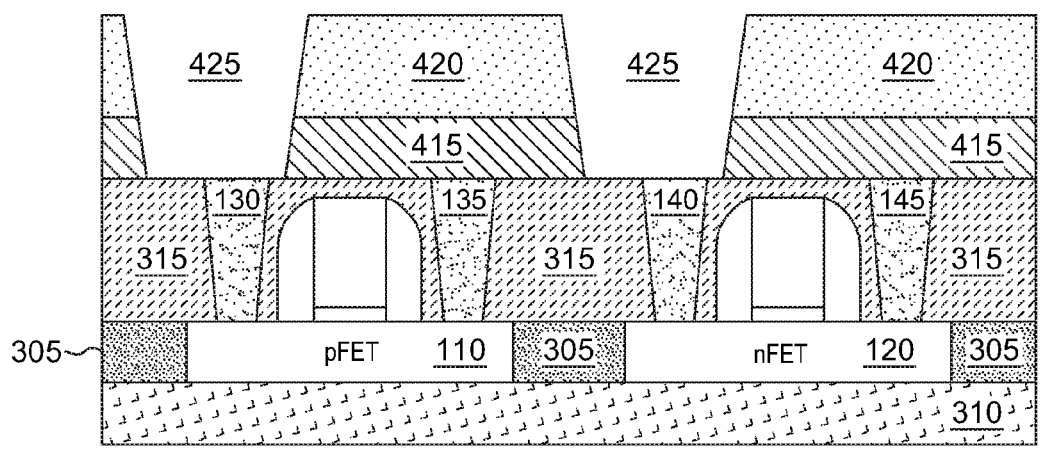

As shown in FIG. 4C, third openings 425 are etched through the third photoresist/pattern transfer layer 420 and the second ILD 415 to the first ILD 315 and the n-type material forming the first metal contact 130 on the PFET 110 and the first metal contact 140 on the NFET 120.

Figure 4D:
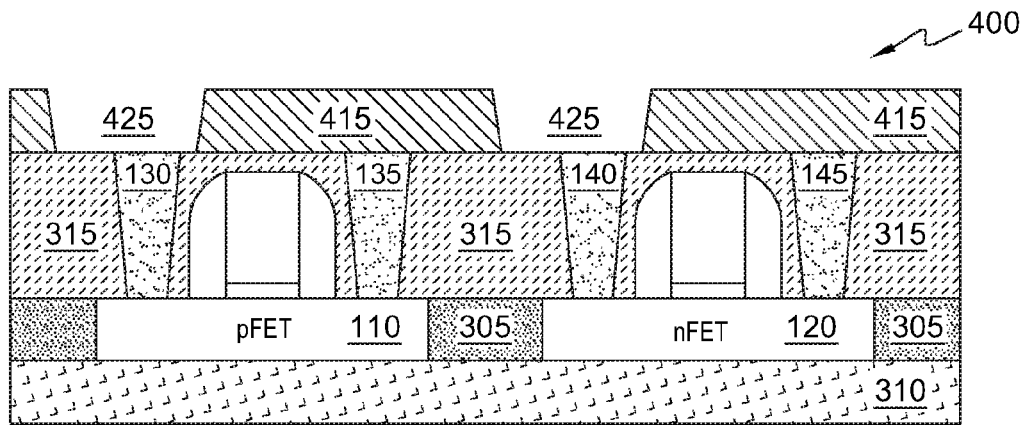

As shown in FIG. 4D, the third photoresist/pattern transfer layer 420 is removed (e.g., using a planarization technique).

Figure 4E:
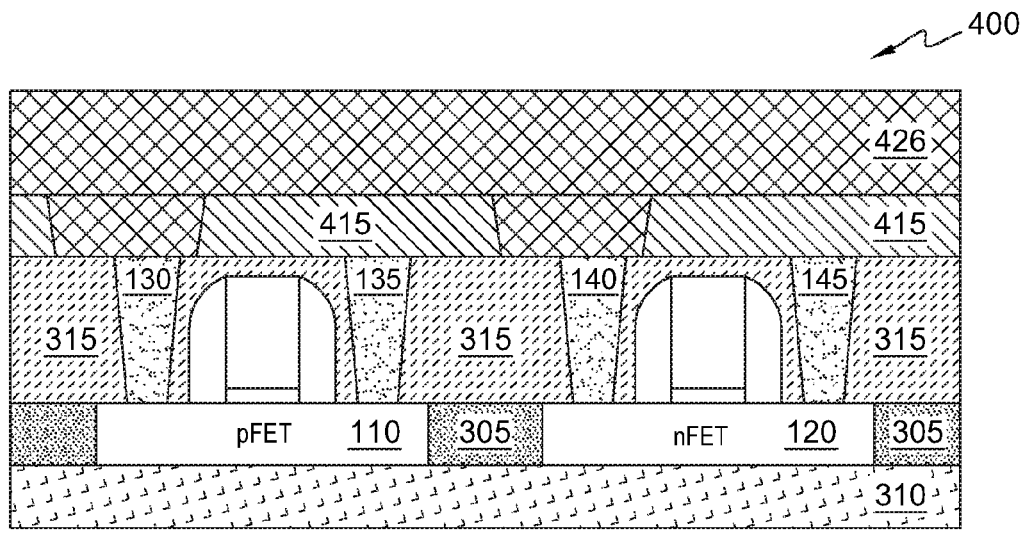

As shown in FIG. 4E, the n-type material (S<0) is deposited as a layer 426 on the second ILD 415 and in the third openings.

Figure 4F:
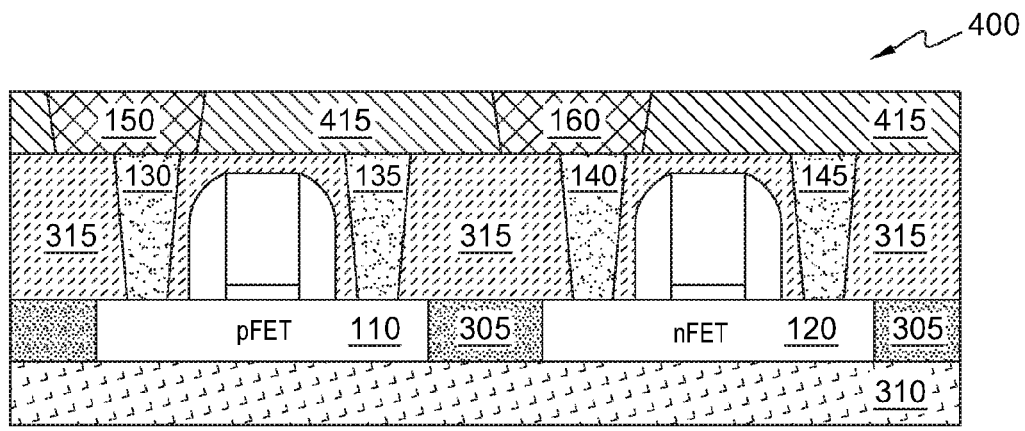

As shown in FIG. 4F, the n-type material layer 426 is removed from the second ILD 415 (e.g., using a planarization technique). N-type material, however, remains in the third openings to form the first metal conductor 150 and the second metal conductor 160 of the M1 layer.

Figure 4G:
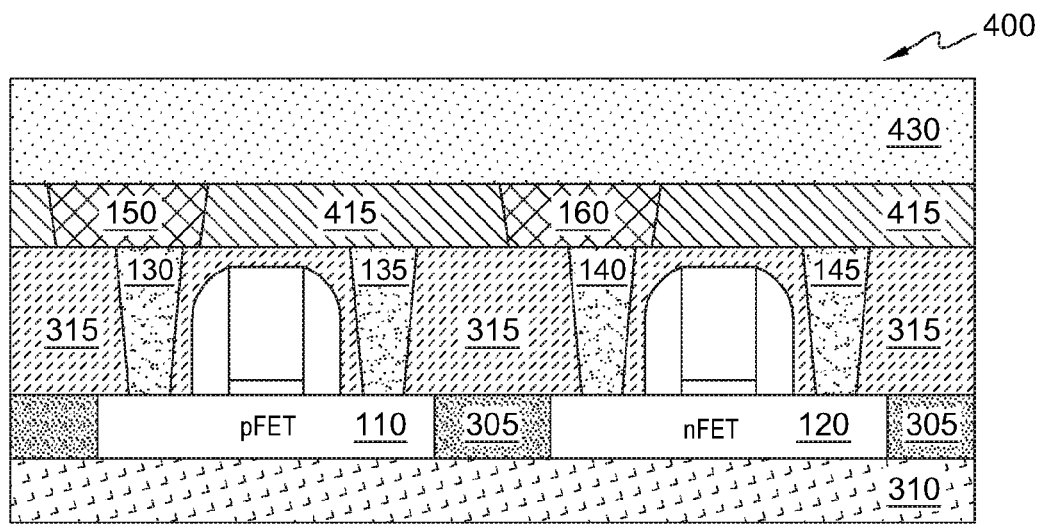

As shown in FIG. 4G, a fourth photoresist/pattern transfer layer 430 is deposited on the second ILD and over the first metal conductor 150 and the second metal conductor 160 of the M1 layer and patterned.

Figure 4H:
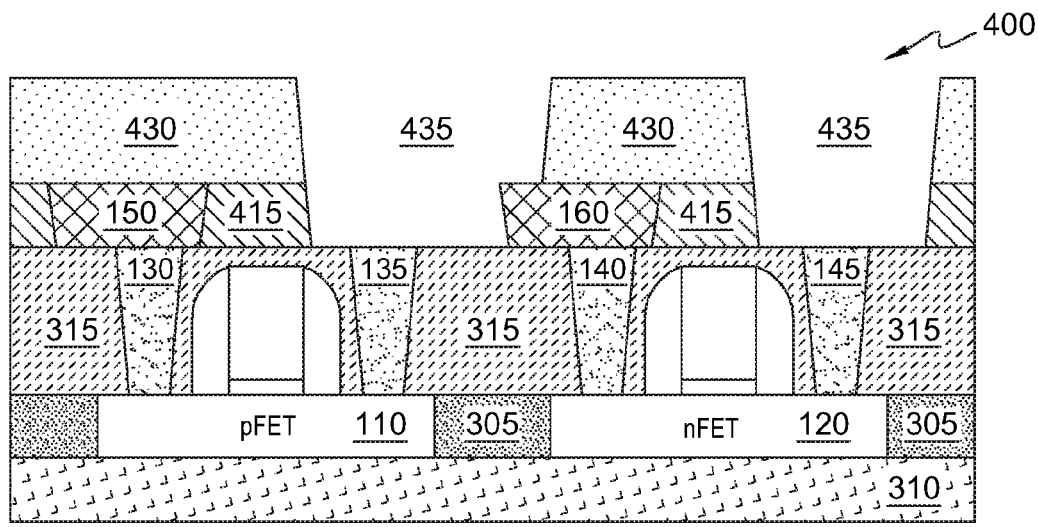

As shown in FIG. 4H, fourth openings 435 are etched through the fourth photoresist/pattern transfer layer 430 and the second ILD 415 to the first ILD 315 and the p-type material in the second openings forming the second metal contact 135 on the PFET 110 and the second metal contact 145 on the NFET 120.

Figure 4I:
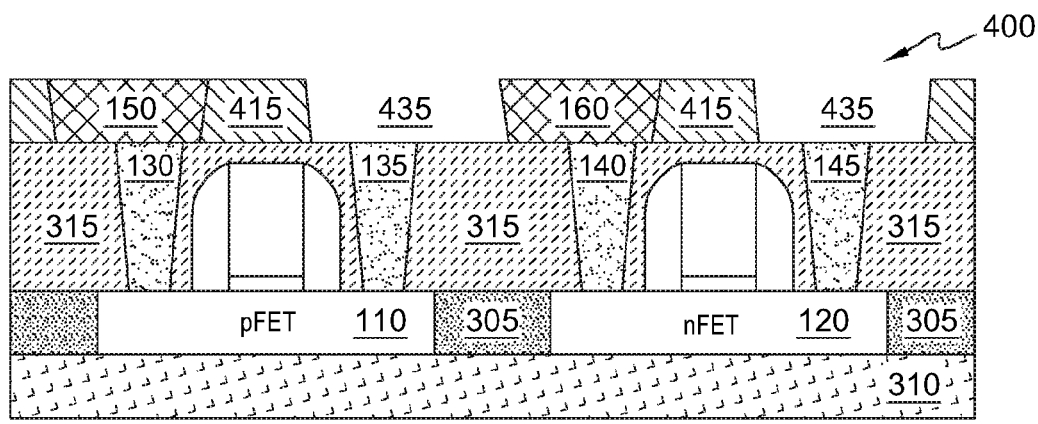

As shown in FIG. 4I, the fourth photoresist/pattern transfer layer 430 is removed.

Figure 4J:
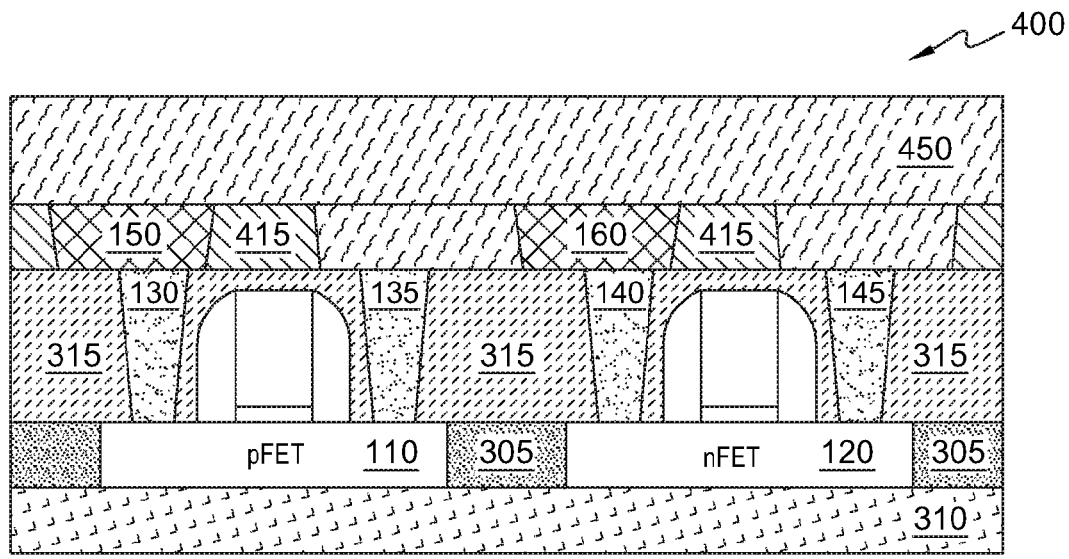

As shown in FIG. 4J, the p-type material (S>0) is deposited as a layer 450 on the second ILD 415, on the n-type material in the third openings forming the first metal conductor 150 and the second metal conductor 160 of the M1 layer, and in the fourth openings 435.

Figure 4K:
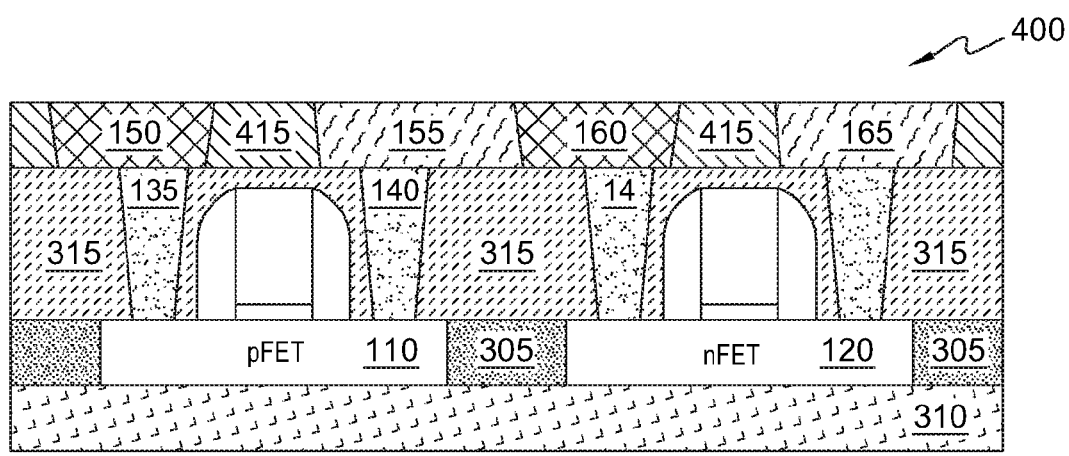

As shown in FIG. 4K, the p-type material layer 450 is removed (e.g., using a planarization technique). P-type material, however, remains in the fourth openings 435 forming the second metal conductor 155 and second metal conductor 165 of a metal layer of the device 100.

Figure 5:
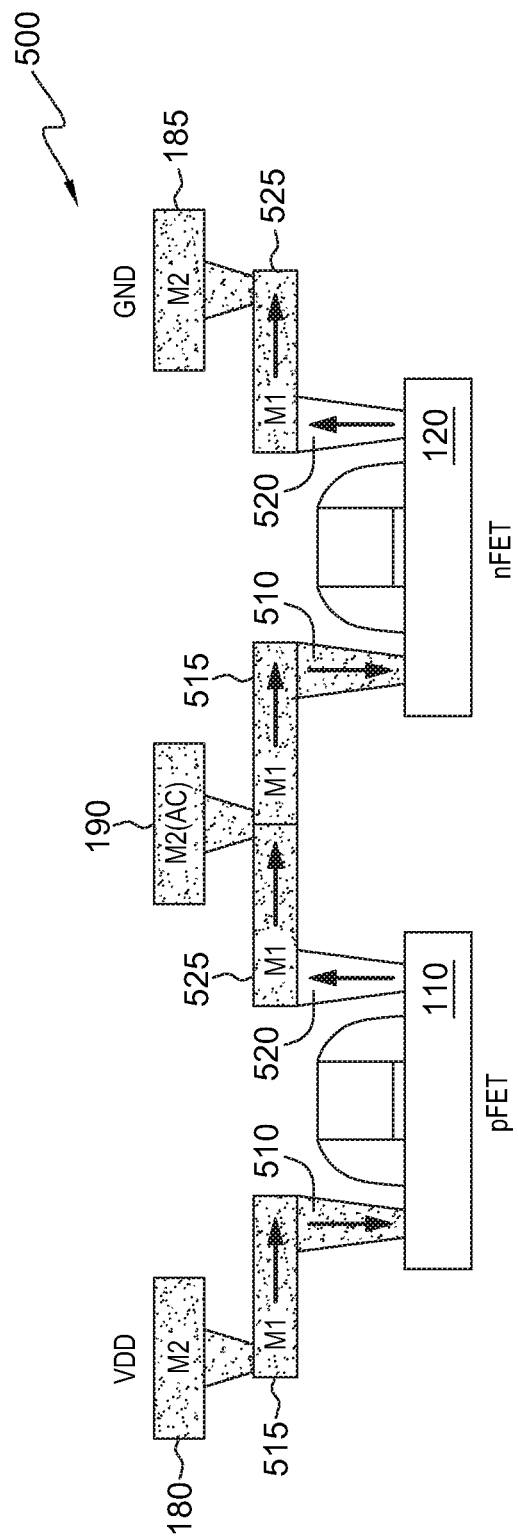
FIG. 5 is a schematic representation of one exemplary embodiment of a semiconductor device structure having multiple n-type materials and multiple p-type materials.

Referring now to FIG. 5, the exemplary methods of forming the CA, vias, and/or metal layers (Mx) may be used to form a device with two or more n-type materials (S<0) and two or more p-type materials (S>0). For example, a device 500 may comprise the PFET 110 and the NFET 120, but the first metal contact 130 on the PFET 110 and the first metal contact 140 on the NFET 120 may be fabricated of a first material 510 that is different from a second material 515 used to fabricate the first metal conductor 150 and the first metal conductor 160 of the M1 layer. Both the first material 510 and the second material 515 may be n-type materials, but they may be different. Similarly, the second metal contact 135 on the PFET 110 and the second metal contact 145 on the NFET 120 may be fabricated of a third material 520 that is different from a fourth material 525 used to fabricate the second metal conductor 155 and the second metal conductor 165 of the M1 layer. Both the third material 520 and the fourth material 525 may be p-type materials, but they may be different. In such an embodiment, materials used in the metal layer formation can be different from those used in the CA formation. In doing so, additional flexibility for material selection can be realized.

In other exemplary embodiments, as shown in FIGS. 6-17, Peltier cooling may be employed adjacent to a FET by using a modified deep trench (DT) process, box isolation (BI) process, or deep trench moat (DTMOAT) process to cool a PN junction in a FET.

Figure 6:
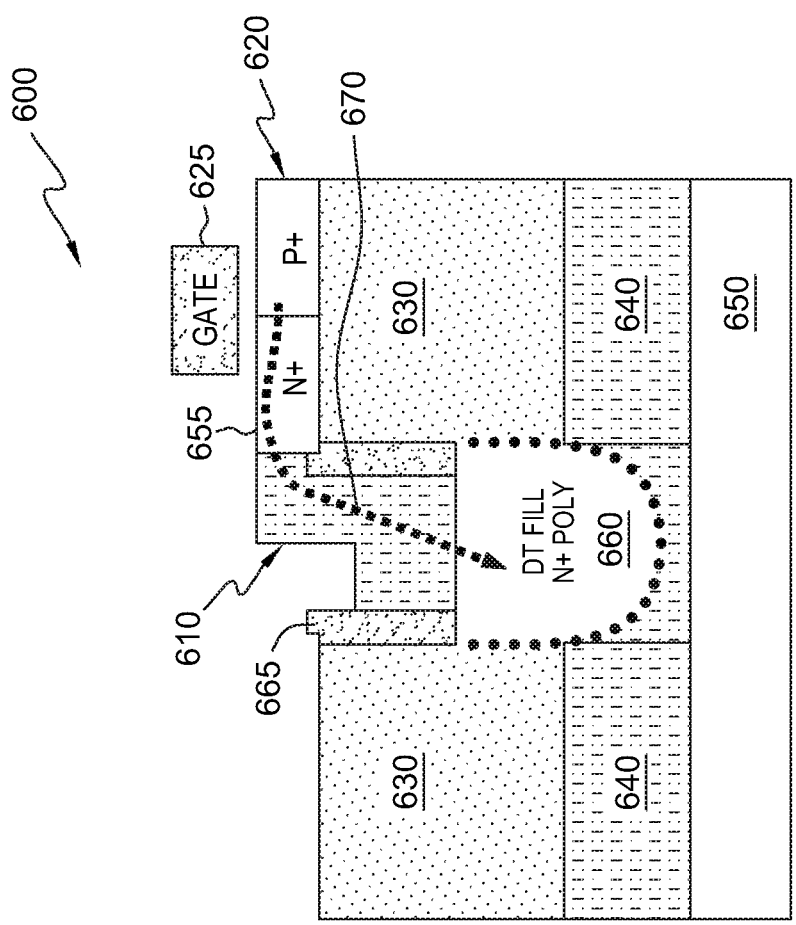
FIG. 6 is a schematic representation of a circuit with a PN junction using a DRAM link as a contact.

Referring to FIG. 6, one exemplary embodiment of a circuit with a PN junction using a DRAM link 610 as a contact is shown generally at 600. Circuit 600 comprises the DRAM link 610 disposed adjacent to and in contact with a device having a fin 620 defining a PN junction and a gate 625 disposed over the fin 620. The fin 620 is located on a BOX layer 630 (or other insulating material such as shallow trench isolation oxide, although the layer is hereinafter referred to as the BOX layer 630), and the BOX layer 630 is located on a substrate of N band material 640, which is located on a P substrate 650 of silicon material (e.g., bulk silicon).

The DRAM link 610 is disposed adjacent to an n+ portion 655 of the fin 620. The DRAM link 610 is formed by removing an existing node dielectric material using a block mask and forming a DT under the removed material such that the DT extends through the BOX layer 630 and into the N band material 640 and is completely contained within the N band layer. The DT is partially filled with n+ polysilicon 660 (S<0), and an oxide ring spacer 665 is disposed on the sides of the DT. The DRAM link 610 is disposed within the opening defined by the oxide ring spacer 665 and on top of the polysilicon 660 such that a portion of the DRAM link 610 is in contact with the n+ portion 655 of the fin 620. In the operation of the circuit 600, heat is transferred from the n+ portion 655 of the fin 620, through the DRAM link 610, and into the polysilicon 660, as shown by arrow 670.

Figure 7:
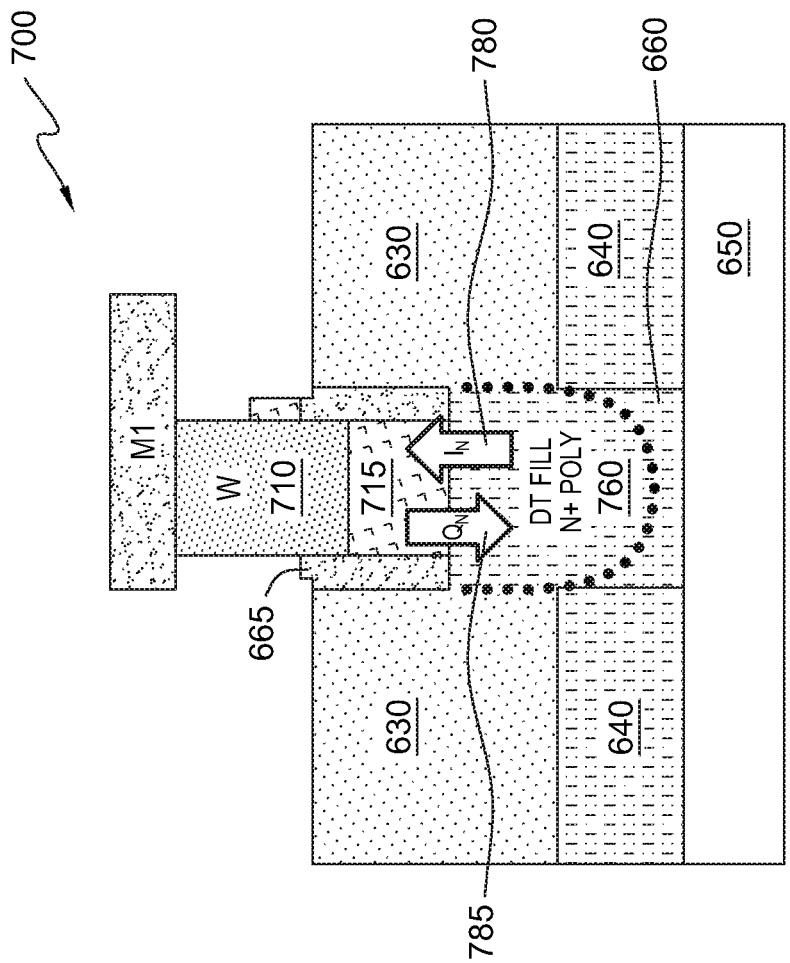
FIG. 7 is a schematic representation of one exemplary embodiment of a circuit with a PN junction in which Peltier cooling is used in conjunction with a metal layer and in which polysilicon material is n+.

Referring to FIG. 7, one exemplary embodiment of a circuit in which Peltier cooling is used in conjunction with an M1 layer is shown generally at 700. Circuit 700 comprises a contact material 710 disposed adjacent to and in contact with the M1 layer and on a contact 715. The contact is formed by removing an existing node dielectric material using a block mask and etching to form a DT. The contact 715 is disposed on n+ polysilicon 760 disposed in the DT extending through the BOX layer 630 and terminating in the N band material 640. The contact material 710 is disposed with an oxide ring spacer 665 located on the sides of the DT.

The contact material 710 comprises a p-type material having S>0, and the n+ polysilicon 660 is the material having S<0 (thus allowing for Peltier cooling). Exemplary materials for the p-type material include, but are not limited to, tungsten (S=7.5). In the operation of the circuit 700, current flow 780 is from the N band material 640, into the polysilicon 660, and through the contact 715 and contact material 710 to the M1 layer. Heat flow 785 is into the polysilicon 660.

Figure 8:
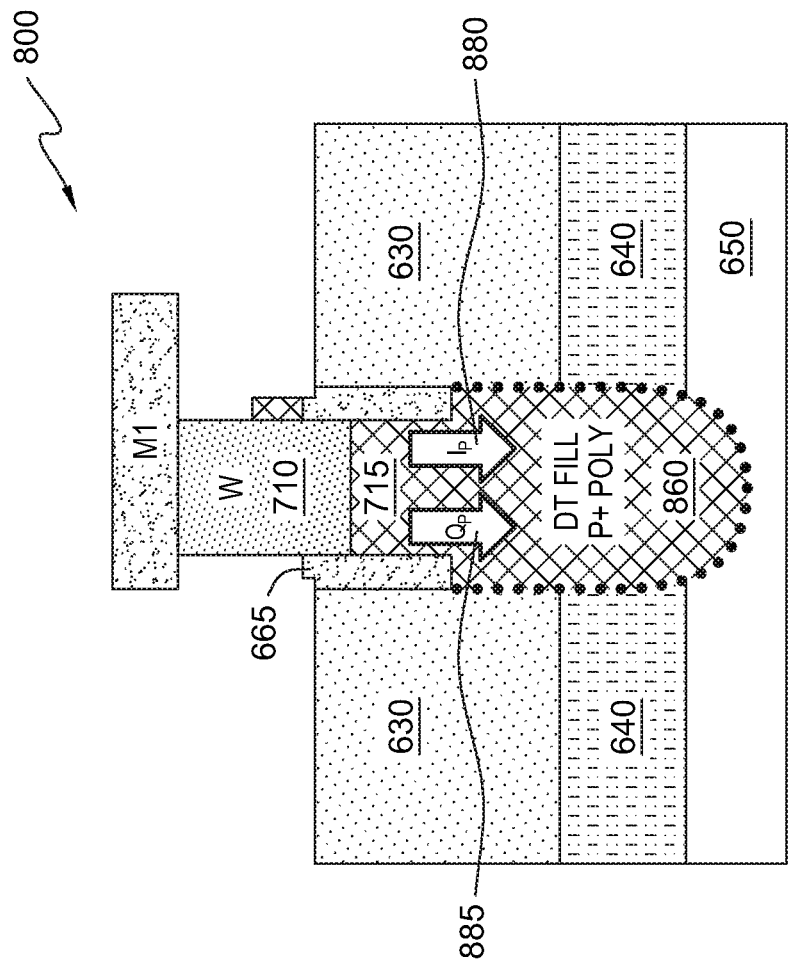
FIG. 8 is a schematic representation of one exemplary embodiment of a circuit in which Peltier cooling is used in conjunction with a metal layer.

Referring to FIG. 8, a circuit 800 is similar to the circuit 700 above, but the polysilicon material is p+ polysilicon material 860, thus causing current flow 880 and heat flow 885 from the polysilicon 860, through the contact 715 and contact material 710 and to the M1 layer. The DT in which the p+ polysilicon 860 is disposed is formed by reactive ion etching and extends beyond the N band 640 and into the P substrate 650 to make electrical contact therewith.

Figure 9:
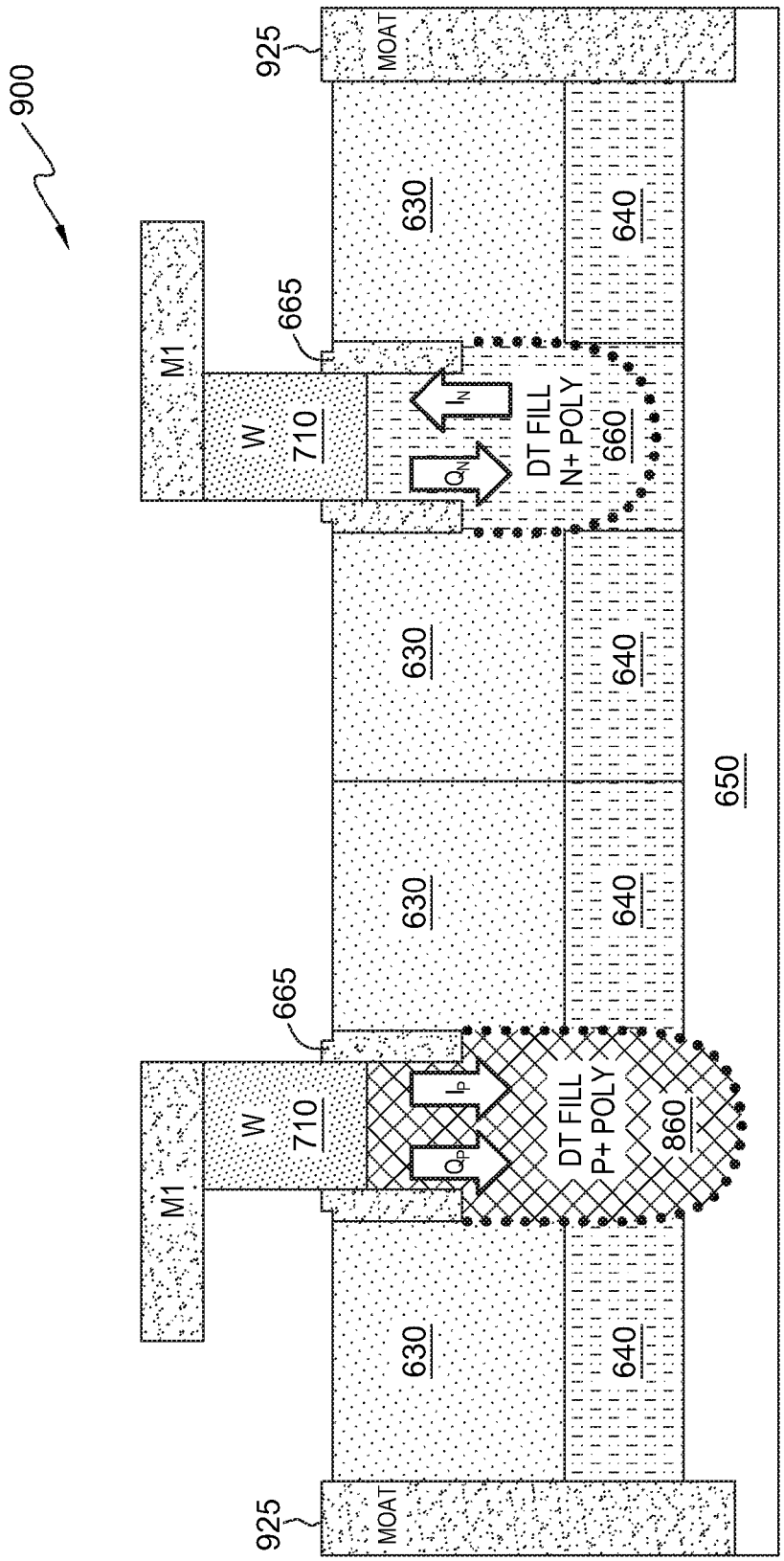
FIG. 9 is a schematic representation of one exemplary embodiment of an array of deep trenches used as a cooling circuit.

Referring to FIG. 9, an exemplary embodiment of a circuit of an array of DTs may be used as a cooling circuit (independent of logic circuits), as shown at 900. In the circuit 900, trickle current is received from a local supply to cool the M1 layer by biasing the N band 640 and the P substrate 650. The M1 layer may be part of a heat shield or heat sink, such a heat shield or heat sink being in two separate portions to avoid shorting. The heat flow is defined as:

$$\text{Heat flow} = (I_P * P_{p+}) + (I_N * P_{n+}) \quad \text{(eq. 4)}$$

In the circuit 900, DTs are isolated by moats 925 and are formed through the BOX layer 630 and into the N band 640. One trench extends through the N band 640 and into the P substrate 650 and is partially filled with p+ polysilicon 860. The other trench terminates in the N band 640 and is partially filled with n+ polysilicon. Oxide ring spacers 665 are disposed in the trenches, and materials 710 (e.g., tungsten) are disposed on the polysilicon. The contact materials 710 are in contact with the M1 layer. In biasing the portion of the circuit 900 on the p+ polysilicon, the M1 layer may be biased with the $V_{DD}$ and the P substrate 650 may be ground, or the M1 layer may be ground and the P substrate 650 may be the difference between ground and a portion of additional voltage bias (e.g., about half of the voltage bias (Δ/2), which may be in the range of about 50 mV to about 500 mV). In biasing the portion of the circuit on the n+ polysilicon, the M1 layer may be $V_{DD}$ and the N band 640 may be the sum of $V_{DD}$ and the portion of the additional voltage bias, or the M1 layer may be ground and the N band 640 may be $V_{DD}$. In the operation of the circuit 900, current flow $I_P$ is into the p+ polysilicon 860 and out into the P substrate 650. Heat flow $Q_P$ is from the metal layer through the contact 710 and P+ polysilicon 860 into the P substrate 650. On the other side, current flow $I_N$ is from the N band 640 into the N+ polysilicon 660 and out into the metal layer. Heat flow $Q_N$ is from the metal layer through the contact 710 and N+ polysilicon 660 into the N band 640. It should be noted that in any of the exemplary embodiments as shown in FIGS. 9-14, by changing the doping types of the substrate, polysilicon filling, etc., alternate biasing schemes to achieve the same purpose can be realized.

Figure 10:
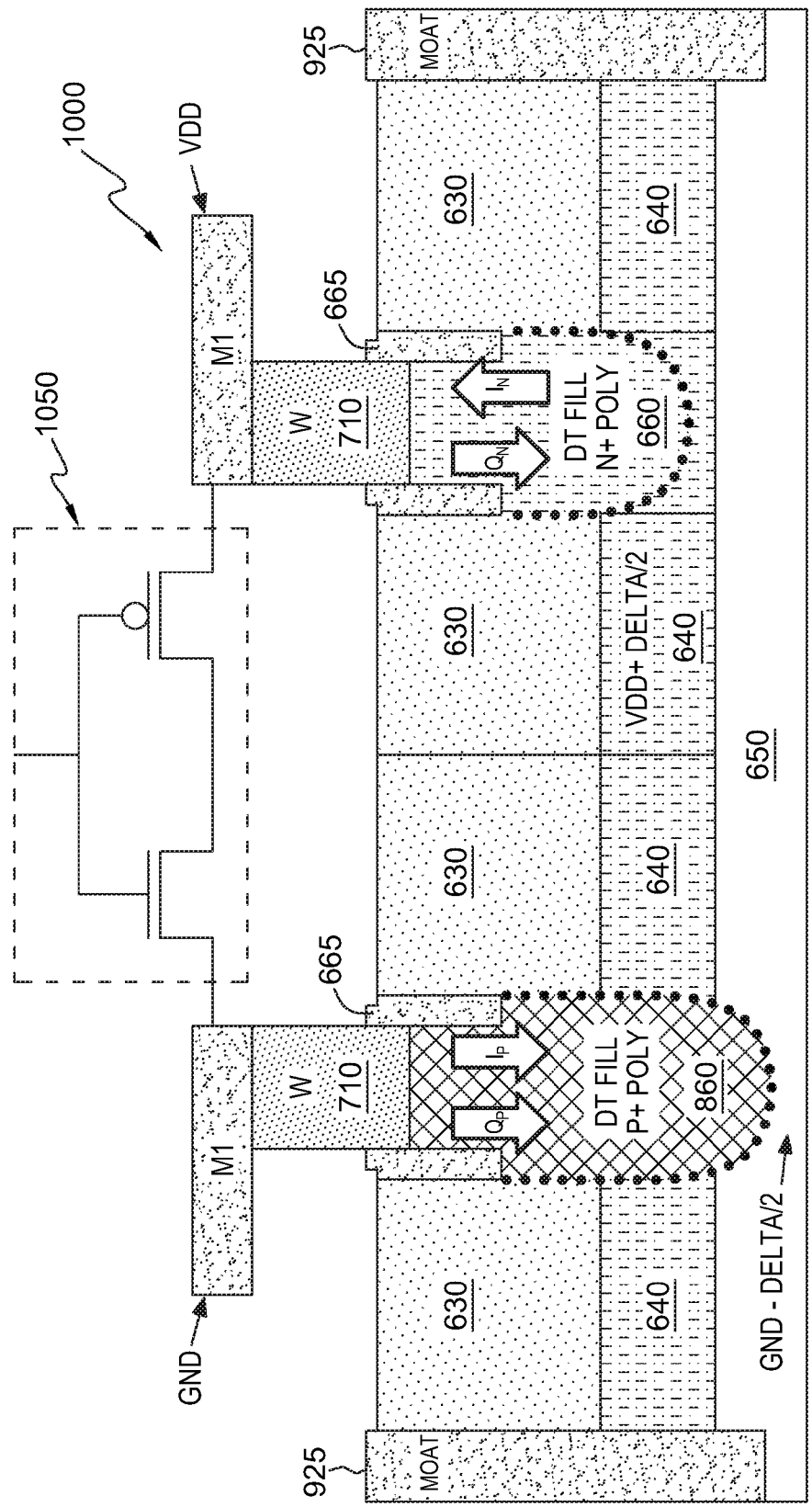
FIG. 10 is a schematic representation of one exemplary embodiment of the array of FIG. 9 incorporating an inverter or ground rail.

Referring to FIG. 10, one exemplary embodiment of a cooling circuit in which the DT is used as part of the circuit and the N band is reverse biased to the substrate is shown generally at 1000. In the circuit 1000, the P substrate 650 is biased at a certain voltage below ground, and the N band is biased at a certain voltage above $V_{DD}$. The M1 layer is part of an inverter $V_{DD}$ or ground rail 1050. The DT p+ polysilicon 860 electrically connects to the P substrate 650 (and not to the N band 640, which would define a reverse biased junction). The DT n+ polysilicon 660 electrically connects to the N band 640 (and not to the P substrate 650, which would define a reverse biased junction). If the inverter switching drags the $V_{DD}$ M1 layer below the N band 640, a current flows. On the other hand, if the switching drags the ground M1 layer above the p+ substrate, a current also flows. In the alternative, the N band to substrate bias could be slightly larger than the $V_{DD}$ to ground. Heat flow is defined by:

$$\text{Heat flow}=(I_{pp}*P_{p+})+(I_{pn}*P_{n+}) \quad (eq. 5)$$

Figure 11:
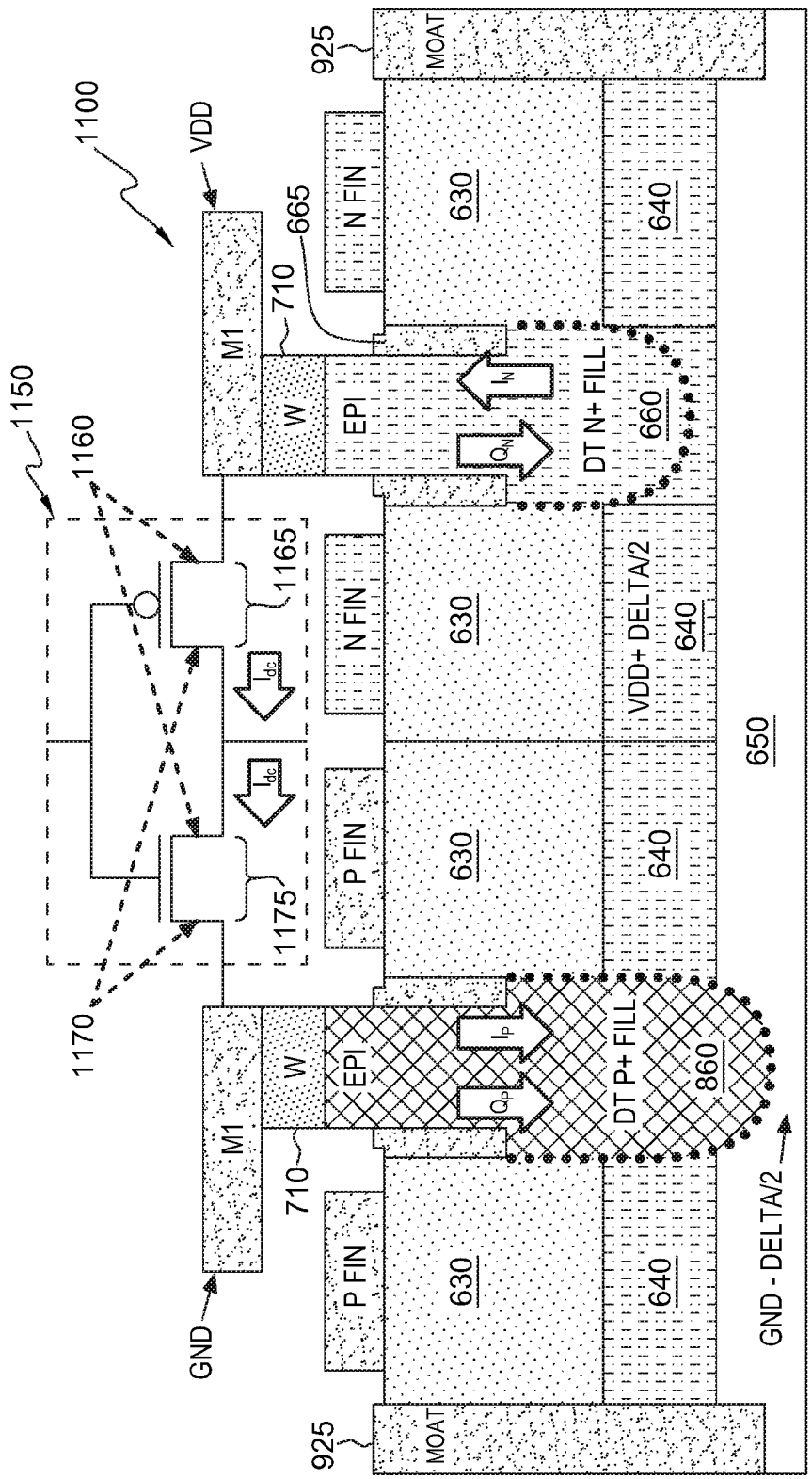
FIG. 11 is a schematic representation of the array of FIG. 10 in which the inverter or ground rail incorporates Peltier contacts.

Referring to FIG. 11, an exemplary embodiment of a cooling circuit using a combination of Peltier cooling contacts is shown generally at 1100. In the circuit 1100, a logic circuit is biased to VDD, the N band is reverse biased to the substrate, and the M1 layer is part of an inverter power rail 1150. The inverter power rail 1150 comprises n+ Peltier contacts 1160 on a first side of a PFET 1165 and on a first side of an NFET 1175 and p+ Peltier contacts 1170 on a second side of the PFET 1165 and on a second side of the NFET 1175. Current flow IDC pumps heat from the inverter power rail 1150 to the M1 layer. Current flow is also from the Gnd M1 layer, through the p+ polysilicon 860 into the P substrate 650, which causes heat flow QP from the Gnd M1 layer into the P substrate 650. On the other side, current flow is also from the N band 640 into the N+ polysilicon 660 and out into the VDD M1 layer, which causes heat flow QN from the VDD M1 layer into the N band 640.

Figure 12:
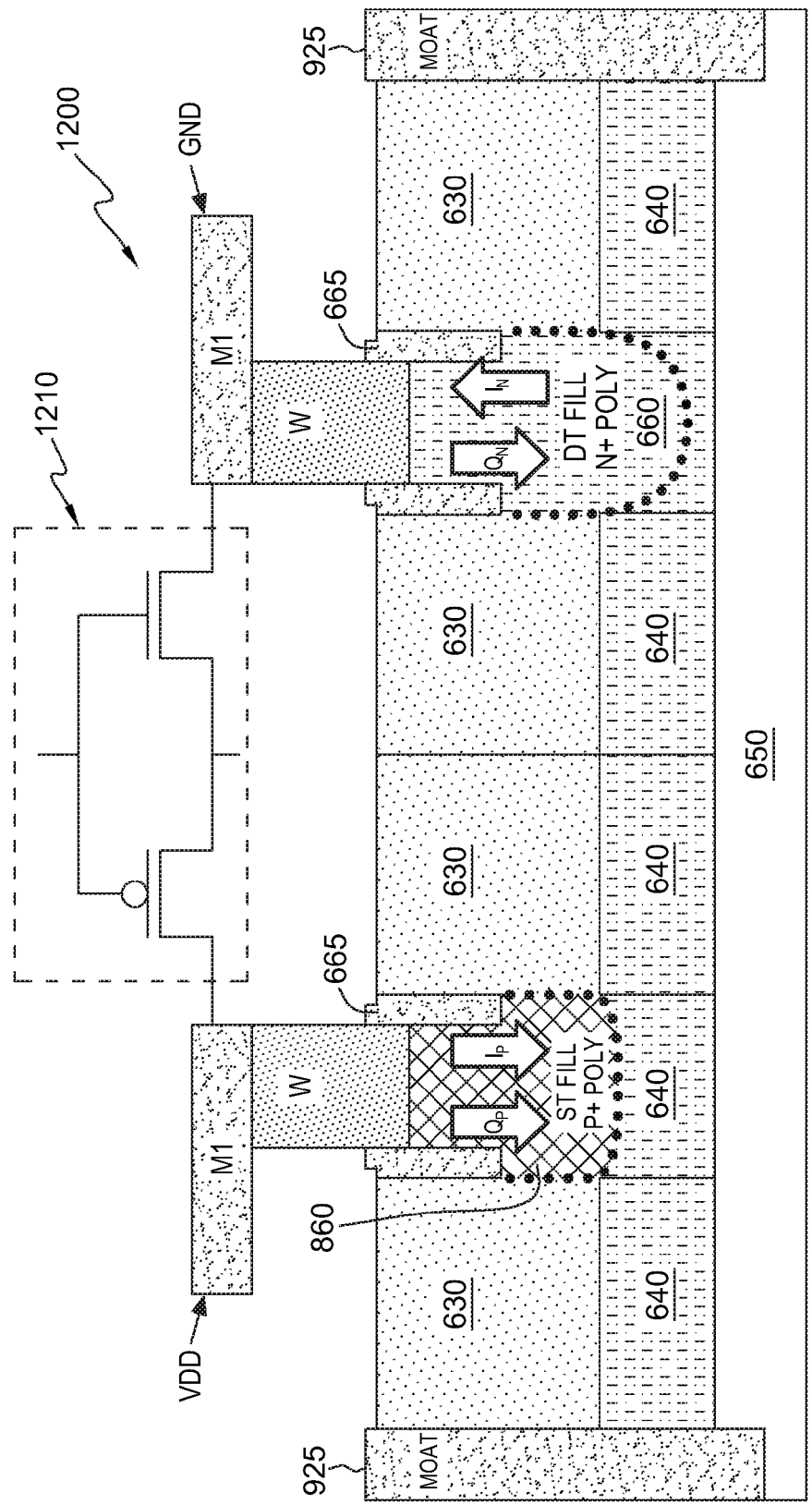
FIG. 12 is a schematic representation of one exemplary embodiment using the inverter or ground rail and in which a shallow trench polysilicon fill is used with a deep trench polysilicon fill.

Referring to FIG. 12, an exemplary embodiment of a cooling circuit using a p+ polysilicon shallow trench fill and a n+ polysilicon deep trench fill is shown at 1200. Circuit 1200 incorporates an inverter power rail 1210. In circuit 1200, an active Peltier cooling path is created by shallow trench fill with the p+ polysilicon 860 contact to the N band 640 (the trench with the Seebeck material of positive coefficient is on top of the N band 640 instead of the P substrate 650) and DT fill with the n+ polysilicon 660 contact to the N band 640. The shallow trench p+ polysilicon 860 has a positive Seebeck coefficient, and the DT n+ polysilicon 660 has a negative Seebeck coefficient. The junction of the p+ polysilicon 860 and the N band 640 is forward biased. Heat is actively removed to the P substrate 650 by both the shallow trench p+ polysilicon 860 and the DT n+ polysilicon 660. Additional biasing for N band 640 versus P substrate 650 is not required. Circuit 1200 is especially useful in high activity circuits, so device cooling effect is not wasted during inactivity.

Figure 13:
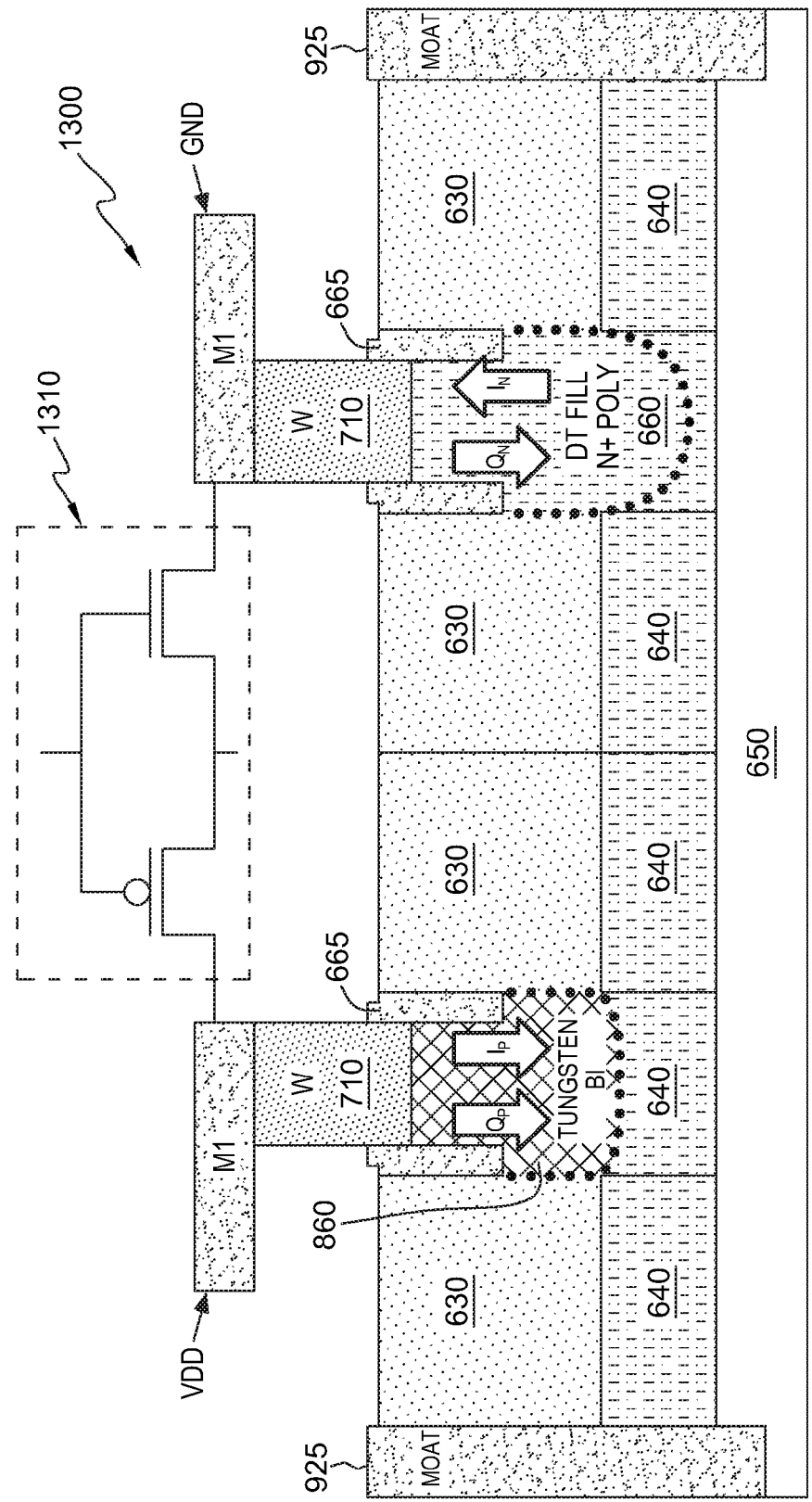
FIG. 13 is a schematic representation of one exemplary embodiment using the inverter or ground rail and in which a box isolation contact is used with a deep trench polysilicon fill.

Referring to FIG. 13, an exemplary embodiment of a cooling circuit using a combination of BI contact and DT n+ polysilicon fill is shown at 1300. Circuit 1300 incorporates an inverter power rail 1310. In circuit 1300, an active Peltier cooling path is created by combining a BI (tungsten or other material in which S>0) contact to the N band 640 and a DT n+ polysilicon fill to the N band 640. Circuit 1300 is especially useful in high activity circuits, so device cooling effect is not wasted during inactivity. Heat flow is defined by:

$$\text{Heat flow}=(I_{pp}*P_{W})+(I_{pn}*P_{n+}) \quad (eq. 6)$$

Figure 14:
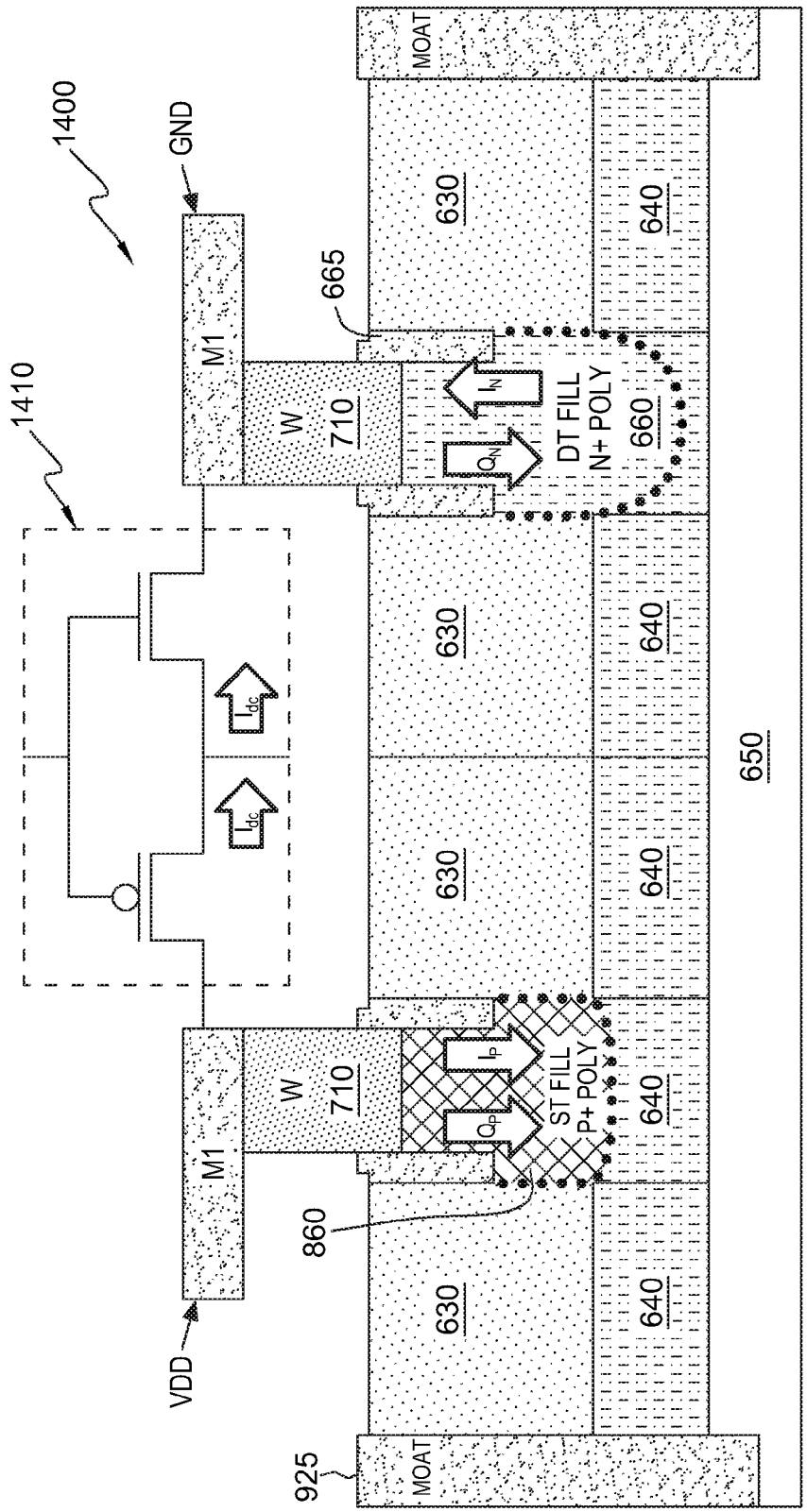
FIG. 14 is a schematic representation of one exemplary embodiment using a shallow trench polysilicon fill and a deep trench polysilicon fill and in which the inverter or ground rail incorporates Peltier contacts.

Referring to FIG. 14, an exemplary embodiment of a cooling circuit using p+ polysilicon shallow trench fill and DT n+ polysilicon fill is shown at 1400. In circuit 1400 (with inverter 1410), an active Peltier cooling path is created by shallow trench fill with p+ polysilicon 860 to contact the N band 640 and DT n+ polysilicon 660 fill to contact the N band 640. The shallow trench p+ polysilicon 860 has S>0, and the DT n+ polysilicon 660 has S<0. The junction defined by the p+ polysilicon 860 and the N band 640 will be forward biased. Heat is removed to the substrate by both the shallow trench p+ polysilicon fill and the DT n+ polysilicon fill. Additional biasing for the N band 640 versus the P substrate 650 is not required. Heat flow is defined as in equation 5.

Figure 15:
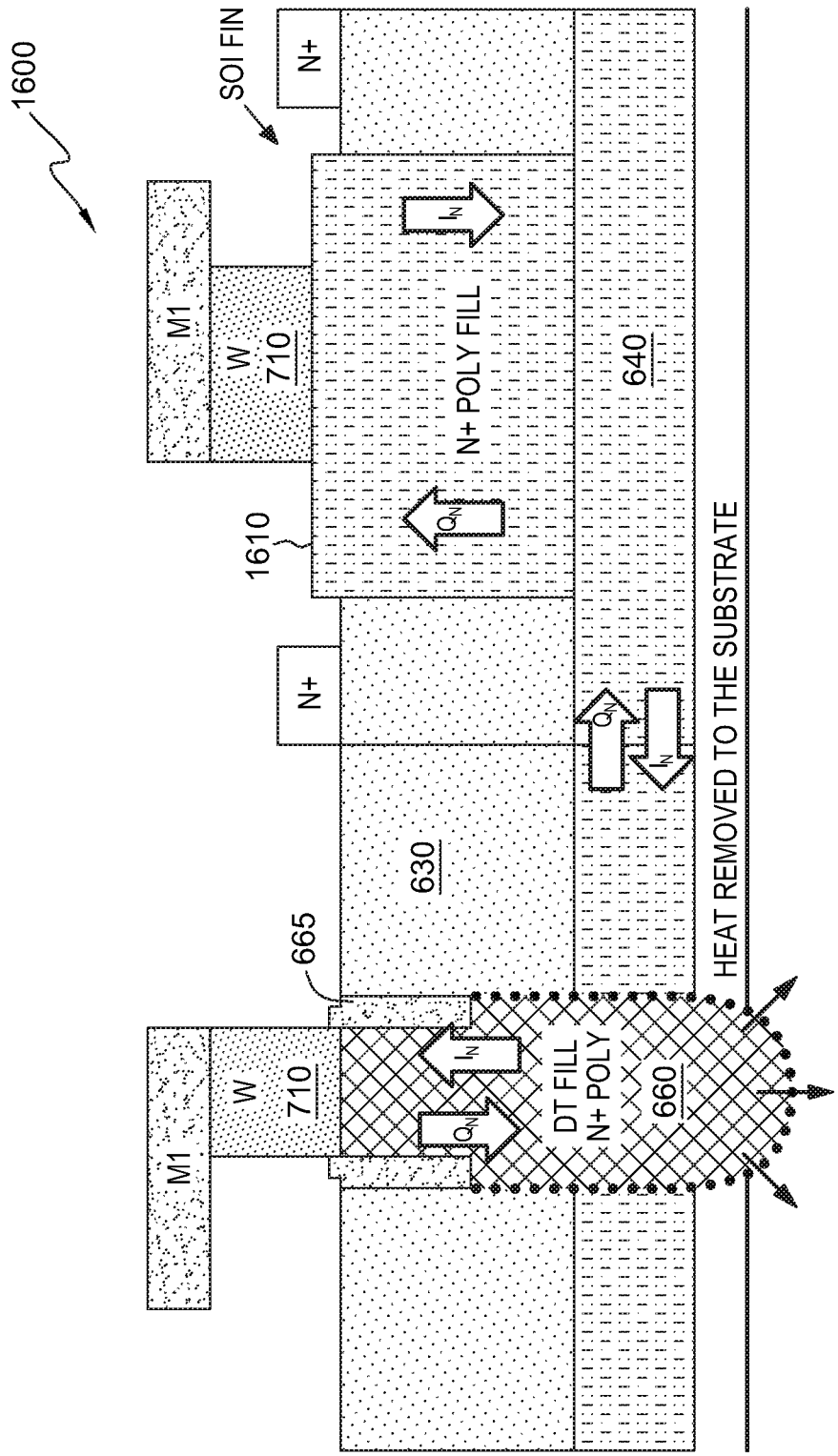
FIG. 15 is a schematic representation of one exemplary embodiment using a combination of deep trench contact and box isolation contact.

Referring to FIG. 15, an exemplary embodiment of a cooling circuit using a combination of DT with BI is shown at 1600. In circuit 1600, current flows from a DT contact (high current, high thermal flux) in a hot region to the N band 640 and returns to the surface through a BI contact 1610 in a cold region. This leverages a current spreading effect.

Figure 16:
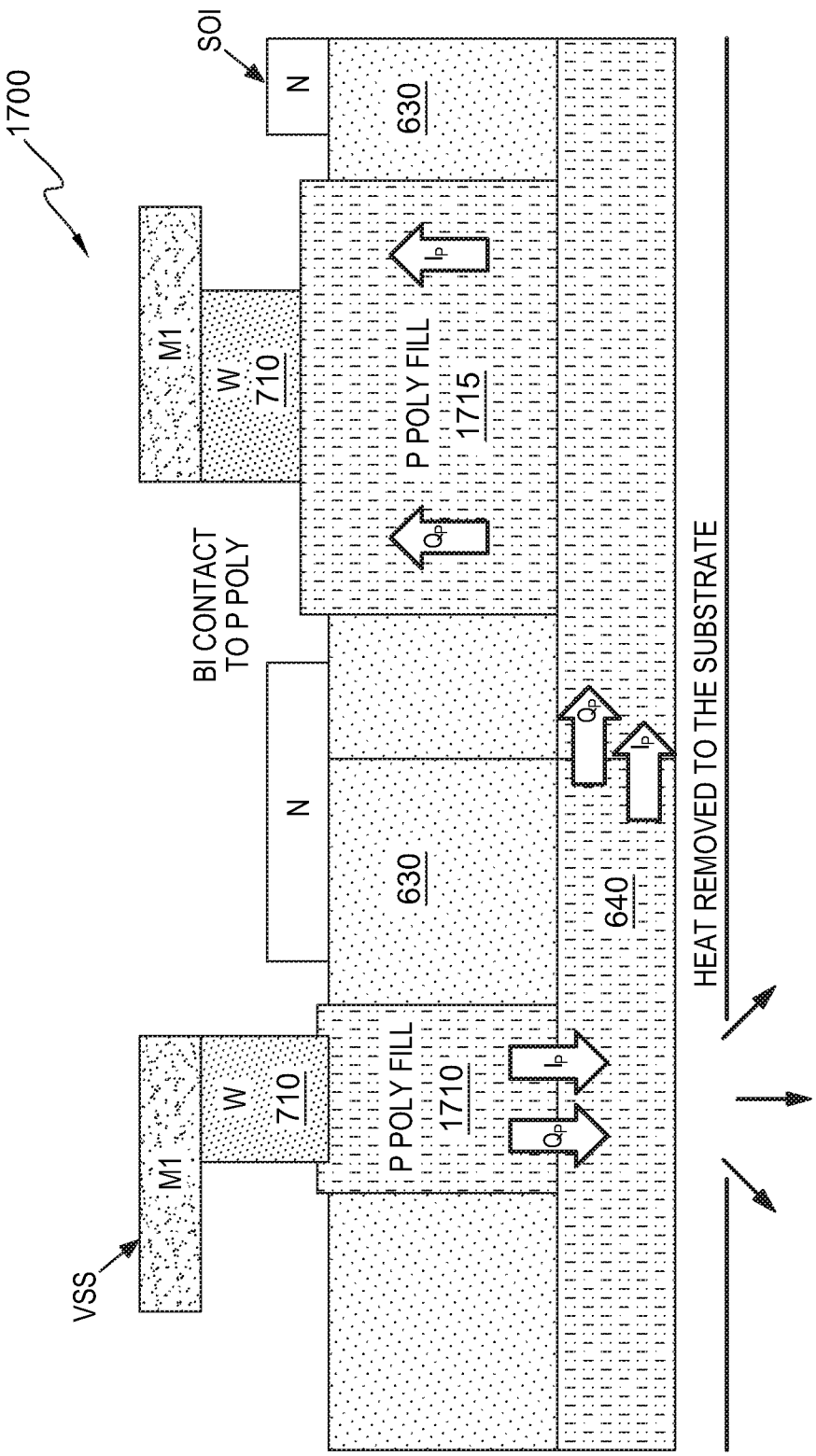
FIG. 16 is a schematic representation of one exemplary embodiment using a combination of different sizes of box isolation contacts.

Referring to FIG. 16, an exemplary embodiment of a cooling circuit using a combination of different sizes of BI contacts is shown at 1700. In circuit 1700, current flows from a first BI contact 1710 (high current density, high thermal flux) in a hot region to the P substrate and returns to the surface through a second BI contact 1715 in a cold region. This leverages a current spreading effect.

Figure 17:
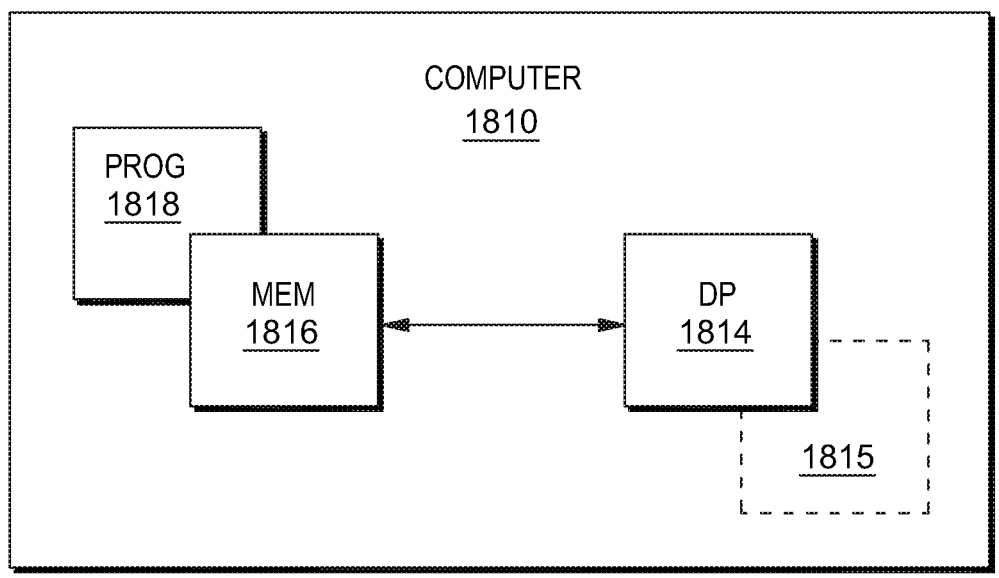
FIG. 17 is a block diagram of various electronic devices and apparatuses that may be suitable for use in forming the structures described herein.

Referring now to FIG. 17, a simplified block diagram of various electronic devices and apparatuses that are suitable for use in practicing the exemplary embodiments described herein is shown. For example, a computer 1810 may be used to control one or more of the processes as described above. The computer 1810 includes a controller, such as a computer or a data processor (DP) 1814 and a computer-readable memory medium embodied as a memory (MEM) 1816 that stores a program of computer instructions (PROG) 1818.

The PROG 1818 includes program instructions that, when executed by the associated DP 1814, enable the various electronic devices and apparatuses to operate in accordance with exemplary embodiments. That is, various exemplary embodiments may be implemented at least in part by computer software executable by the DP 1814 of the computer 1810, or by hardware, or by a combination of software and hardware (and firmware).

The computer 1810 may also include dedicated processors, for example a processor 1815 that controls the processes of etching, planarizing, masking, and deposition.

The computer readable MEM 1816 may be of any type suitable to the local technical environment and may be implemented using any suitable data storage technology, such as semiconductor based memory devices, flash memory, magnetic memory devices and systems, optical memory devices and systems, fixed memory, and removable memory. The DP 1814 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the methods described herein.

Based on the foregoing, it should be apparent that various exemplary embodiments provide methods to form the device structures described herein.

Figure 18:
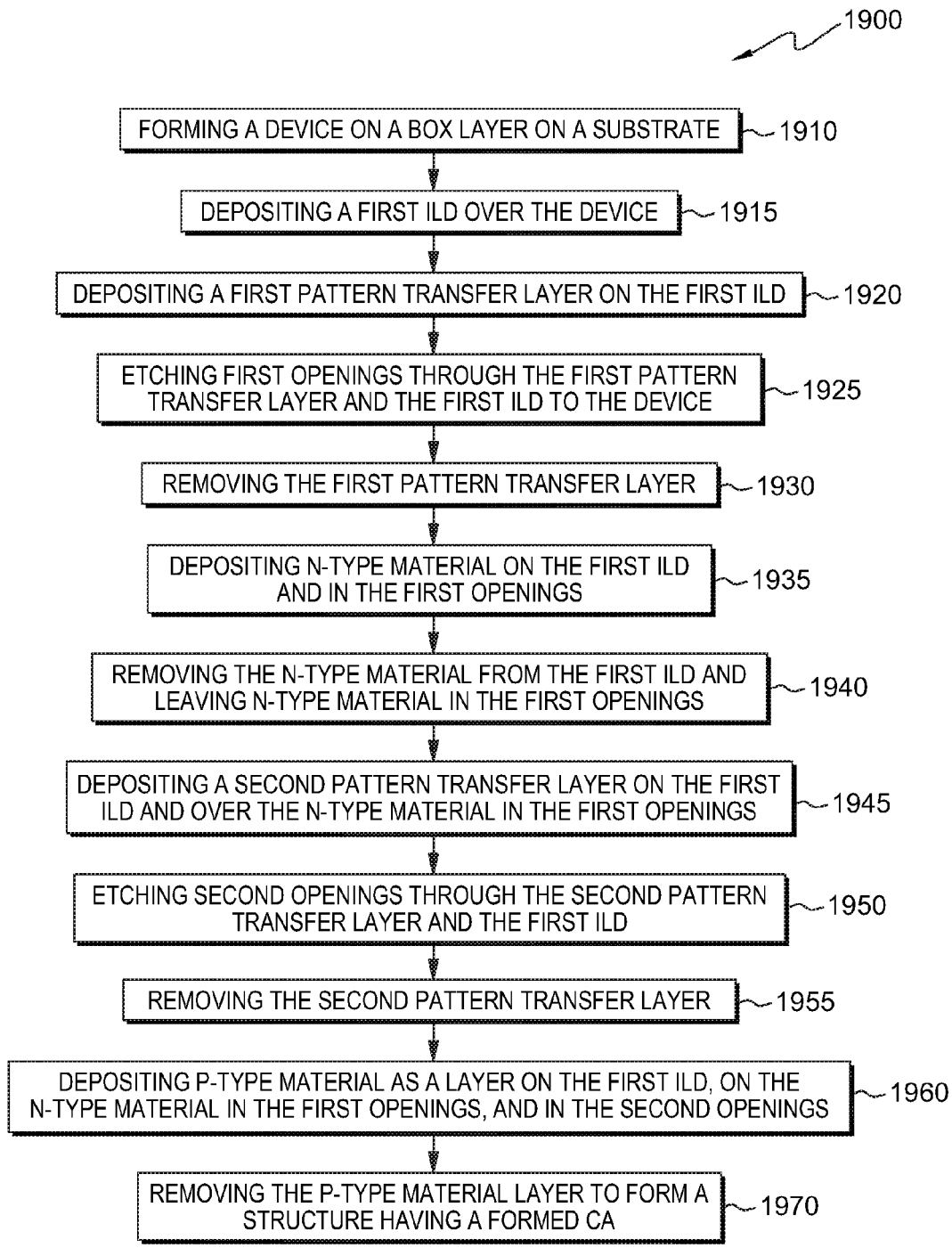
FIG. 18 is a logic flow diagram that illustrates the operation of an exemplary method, and a result of execution of computer program instructions embodied on a computer readable memory, in accordance with an exemplary embodiment of the manufacture of the CA or vias described herein.

FIG. 18 is a logic flow diagram that illustrates the operation of one exemplary embodiment of a method 1900 for forming the CA or vias using double patterning. In method 1900, at 1910, a device is formed on a BOX layer on a substrate. At 1915, a first ILD layer is deposited over the device. A first pattern transfer layer is deposited on the first ILD layer at 1920. At 1925, first openings are etched through the first pattern transfer layer and the first ILD layer to the device. At 1930, the first pattern transfer layer is removed. An n-type material is deposited on the first ILD and in the first openings at 1935. At 1940, the n-type material on the first ILD layer and in the first openings is removed. At 1945, a second pattern transfer layer is deposited on the first ILD layer and over the n-type material in the first openings. At 1950, second openings are etched through the second pattern transfer layer and the first ILD layer. The second pattern transfer layer is removed at 1955. At 1960, a p-type material is deposited as a layer on the first ILD layer, on the n-type material in the first openings, and in the second openings. At 1970, the p-type material layer is removed to form a structure having a formed CA.

Figure 19:
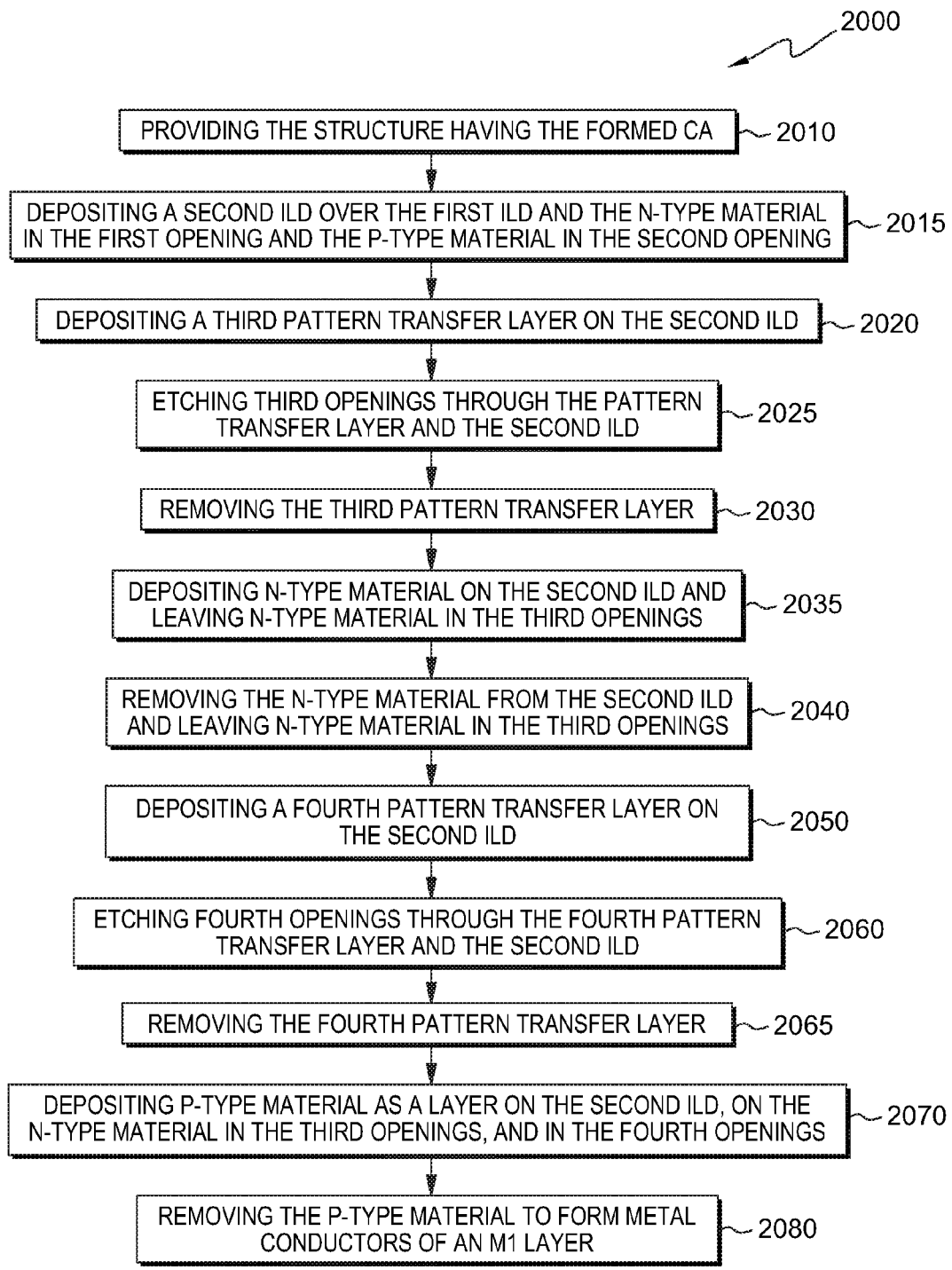
FIG. 19 is a logic flow diagram that illustrates the operation of one exemplary method, and a result of execution of computer program instructions embodied on a computer readable memory, in accordance with an exemplary embodiment of the forming of Mx layers.

FIG. 19 is a logic flow diagram that illustrates the operation of one exemplary embodiment of a method 2000 for forming Mx layers using double patterning. In method 2000, the structure having the formed CA is provided at 2010. At 2015, a second ILD layer is deposited over the first ILD layer and the n-type material in the first opening and the p-type material in the second opening. At 2020, a third pattern transfer layer is deposited on the second ILD layer. Third openings are etched through the pattern transfer layer and the second ILD layer at 2025. At 2030, the third pattern transfer layer is removed. At 2035, an n-type material is deposited on the second ILD layer and in the third openings. At 2040, the n-type material is removed from the second ILD layer, and the n-type material is left in the third openings. At 2050, a fourth pattern transfer layer is deposited on the second ILD layer. At 2060, fourth openings are etched through the fourth pattern transfer layer and the second ILD layer. The fourth pattern transfer layer is removed at 2065. At 2070, p-type material is deposited as a layer on the second ILD layer, on the n-type material in the third openings, and in the fourth openings. At 2080, p-type material is removed to form metal conductors of a metal layer.

In one exemplary aspect, a semiconductor structure comprises one or more semiconductor devices, each of the semiconductor devices having two or more electrical connections; one or more first conductors connected to a first electrical connection on the semiconductor device, the first conductor comprising a first material having a positive Seebeck coefficient; and one or more second conductors connected to a second electrical connection on the semiconductor device, the second conductor comprising a second material having a negative Seebeck coefficient. The first conductor and the second conductor conduct electrical current through the semiconductor device and conduct heat away from the semiconductor device.

The semiconductor structure may comprise a third conductor connected to the first conductor, the third conductor comprising a third material having a positive Seebeck coefficient that is different from the positive Seebeck coefficient of the first material, and may further comprise a fourth conductor connected to the second conductor, the fourth conductor comprising a fourth material having a negative Seebeck coefficient that is different from the negative Seebeck coefficient of the third material. The first material and the second material may comprise, respectively, Cu-Constantan, Nichrome-Constantan, Tungsten-Rhenium, Tungsten-Constantan, Tungsten-Doped $Bi_2Te_3$, or n+ polysilicon-p+ polysilicon. A difference between the coefficient of the first material having a positive Seebeck coefficient and the second material having a negative Seebeck coefficient may be greater than about 40 μV/K. The semiconductor device may be a transistor, a FET, a diode, a resistor, a chip-embedded device, a circuit block, an inverter, a power rail, a logic gate, or a combination of any of the foregoing. The first electrical connection on the semiconductor device and the second electrical connection on the semiconductor device may be encapsulated within a liner material. The liner material may be Ti/TiN. The liner material may be in direct contact with a silicide material of at least one of the semiconductor devices. One of the conductors and the electrical connections may comprise 0.5% manganese alloyed copper, and the other of the electrical connections and the conductors may comprise at least 30% nickel alloyed copper.

In another exemplary aspect, a semiconductor structure comprises a P substrate; an N band disposed on the P substrate; an oxide layer on the N band; a first material having a positive Seebeck coefficient disposed in a first trench extending into the oxide layer, the N band and the P substrate; a second material having a negative Seebeck coefficient disposed in a second trench extending into the oxide layer and the N band; a first contact on the first material and providing contact with an M1 layer; and a second contact on the second material and providing contact with the M1 layer. The first material is configured to provide a first heat flow from the M1 layer into the P substrate. The second material is configured to provide a second heat flow from the M1 layer into the N band. A first current flow is from the first contact, into the first material, and to the P substrate. A second current flow is from the N band, into the second material, and to the second contact.

The first material having a positive Seebeck coefficient may be p+ polysilicon, and the second material having a negative Seebeck coefficient may be n+ polysilicon. The semiconductor structure may further comprise an oxide ring spacer in the first trench and separating the second material from the oxide layer. The P substrate may be biased at a voltage below ground, and the N band may be biased at a voltage above a power supply voltage. The M1 layer may be ground and the P substrate may be the difference between ground and a portion of the voltage bias. The semiconductor structure may further comprise an inverter power rail on the M1 layer, the inverter power rail comprising n+ Peltier contacts on a first side of a PFET and on a first side of an NFET and p+ Peltier contacts on a second side of the PFET and on a second side of the NFET. One of the M1 layer and either of the P substrate or the N band may be configured to be biased with a power supply voltage and the other of the M1 layer and either of the P substrate or the N band may be configured to be ground.

In another exemplary aspect, a method comprises patterning a first layer disposed over a semiconductor device; etching first openings through the first layer to the semiconductor device; depositing a first material having a first Seebeck coefficient in the first openings; patterning a second layer over the semiconductor device and the n-type material; etching second openings through the second layer to the semiconductor device; and depositing a second material having a second Seebeck coefficient in the second openings. One of the first material and the second material may have a positive Seebeck coefficient and the other of the second material and the first material may have a negative Seebeck coefficient. The deposited first material and the deposited second material may form portions of a CA.

Patterning a first layer disposed over a semiconductor device may comprise depositing a first ILD layer and depositing a first pattern transfer layer on the first ILD. The method may further comprise removing the patterned first layer prior to depositing the first material in the first openings. The method may further comprise removing the first material from the first ILD layer and leaving the first material in the first openings prior to depositing the second material in the second openings. The method may further comprise patterning, etching, and depositing third materials and fourth materials to form portions of an M1 layer.

The foregoing description has provided by way of exemplary and non-limiting examples a full and informative description of the best method and apparatus presently contemplated by the inventors for carrying out various exemplary embodiments. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments.

Furthermore, some of the features of the preferred embodiments could be used to advantage without the corresponding use of other features. As such, the foregoing description should be considered as merely illustrative of the principles, and not in limitation thereof.

What is claimed is:

1. A semiconductor structure, comprising:
   one or more semiconductor devices, each of the semiconductor devices having two or more electrical connections;
   one or more first conductors connected to a first electrical connection on the semiconductor device, the first conductor being in a metal level above the semiconductor device and comprising a first metal material having a positive Seebeck coefficient; and
   one or more second conductors connected to a second electrical connection on the semiconductor device, the second conductor being in the metal level above the semiconductor device and comprising a second metal material that is different from the first metal material and that has a negative Seebeck coefficient,
   wherein the one or more first conductors and the one or more second conductors conduct electrical current through the semiconductor device and conduct heat away from the semiconductor device.

2. The semiconductor structure of claim 1, further comprising a third conductor connected to the first conductor, the third conductor comprising a third metal material having a positive Seebeck coefficient that is different from the positive Seebeck coefficient of the first metal material, and further comprising a fourth conductor connected to the second conductor, the fourth conductor comprising a fourth metal material having a negative Seebeck coefficient that is different from the negative Seebeck coefficient of the second metal material.

3. The semiconductor structure of claim 1, wherein the first metal material and the second metal material comprise, respectively, Cu-Constantan, Nichrome-Constantan, Tungsten-Rhenium, Tungsten-Constantan, or Tungsten-Doped $Bi_2Te_3$.

4. The semiconductor structure of claim 1, wherein a difference between the positive Seebeck coefficient of the first metal material and the negative Seebeck coefficient of the second metal material is greater than about 40 µV/K.

5. The semiconductor structure of claim 1, wherein the semiconductor device is a transistor, a field effect transistor, a diode, a resistor, a chip-embedded device, a circuit block, an inverter, a power rail, a logic gate, or a combination of any of the foregoing.

6. The semiconductor structure of claim 1, wherein the first electrical connection on the semiconductor device and the second electrical connection on the semiconductor device are encapsulated within a liner material.

7. The semiconductor structure of claim 6, wherein the liner material is in direct contact with a silicide material of at least one of the semiconductor devices.

8. A semiconductor structure comprising:
   a field effect transistor;
   a first metal conductor in a metal level above the field effect transistor;
   a first metal contact electrically connecting a first region of the field effect transistor to the first metal conductor;
   a second metal conductor in the metal level above the field effect transistor; and,
   a second metal contact electrically connecting a second region of the field effect transistor to the second metal conductor,
   wherein the first metal contact comprises a first metal material that has a negative Seebeck coefficient and the second metal contact comprises a second metal material that is different from the first metal material and that has a positive Seebeck coefficient.

9. The semiconductor structure of claim 8, wherein the first metal conductor has a negative Seebeck coefficient and the second metal conductor has a positive Seebeck coefficient.

10. The semiconductor structure of claim 8, wherein a difference between the negative Seebeck coefficient of the first metal material and the positive Seebeck coefficient of the second metal material is greater than about 40 µV/K.

11. The semiconductor structure of claim 8, wherein the first metal contact and the second metal contact are each encapsulated within a liner material.

12. The semiconductor structure of claim 8, further comprising:
   additional first metal conductors in upper metal levels above the metal level and electrically connected to the first metal conductor, wherein the additional first metal conductors have a negative Seebeck coefficient; and
   additional second metal conductors in the upper metal levels above the metal level and electrically connected to the second metal conductor, wherein the additional second metal conductors have a positive Seebeck coefficient.

13. A semiconductor structure comprising:
   a pair of field effect transistor comprising a P-type field effect transistor and an N-type field effect transistor,
   a first metal conductor in a metal level above the P-type field effect transistor;
   a first metal contact electrically connecting a first region of the P-type field effect transistor to the first metal conductor;
   a second metal conductor in the metal level above the P-type field effect transistor and electrically connected to the N-type field effect transistor; and,
   a second metal contact electrically connecting a second region of the P-type field effect transistor to the second metal conductor,
   wherein the first metal contact comprises a first metal material that has a negative Seebeck coefficient and the second metal contact comprises a second metal material that is different from the first metal material and that has a positive Seebeck coefficient.

14. The semiconductor structure of claim 13, wherein the first metal conductor has a negative Seebeck coefficient and the second metal conductor has a positive Seebeck coefficient.

15. The semiconductor structure of claim 13, wherein a difference between the negative Seebeck coefficient of the first metal material and the positive Seebeck coefficient of the second metal material is greater than about 40 $\mu$V/K.

16. The semiconductor structure of claim 13, wherein the first metal contact and the second metal contact are each encapsulated within a liner material.

17. The semiconductor structure of claim 13, further comprising:
   additional first metal conductors in upper metal levels above the metal level and electrically connected to the first metal conductor, wherein the additional first metal conductors have a negative Seebeck coefficient; and
   additional second metal conductors in the upper metal levels above the metal level and electrically connected to the second metal conductor, wherein the additional second metal conductors have a positive Seebeck coefficient.

18. The semiconductor structure of claim 13, further comprising:
   a third metal conductor in the metal level above the N-type field effect transistor, the third metal conductor contacting the second metal conductor;
   a third metal contact electrically connecting a third region of the N-type field effect transistor to the third metal conductor;
   a fourth metal conductor in the metal level above the N-type field effect transistor; and,
   a fourth metal contact electrically connecting a fourth region of the N-type field effect transistor to the second metal conductor,
   wherein the third metal contact comprises the first metal material and the fourth metal contact comprises the second metal material.

* * * * *